US012581726B2

(12) United States Patent
Yoshioka et al.

(10) Patent No.: US 12,581,726 B2
(45) Date of Patent: Mar. 17, 2026

(54) ELECTRONIC COMPONENT AND ELECTRONIC CIRCUIT COMPRISING A CAPACITOR AND AN INDUCTOR

(71) Applicant: Murata Manufacturing Co., Ltd., Kyoto-fu (JP)

(72) Inventors: Yoshimasa Yoshioka, Nagaokakyo (JP); Hiroshi Nakagawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 462 days.

(21) Appl. No.: 18/160,914

(22) Filed: Jan. 27, 2023

(65) Prior Publication Data

US 2023/0246022 A1 Aug. 3, 2023

(30) Foreign Application Priority Data

Jan. 28, 2022 (JP) ................................. 2022-012142

(51) Int. Cl.
| | |
|---|---|
| *H10D 1/20* | (2025.01) |
| *H10D 1/62* | (2025.01) |
| *H10D 1/68* | (2025.01) |
| *H10D 84/00* | (2025.01) |
| *H10D 84/03* | (2025.01) |

(52) U.S. Cl.
CPC ............. *H10D 84/201* (2025.01); *H10D 1/20* (2025.01); *H10D 1/716* (2025.01); *H10D 84/038* (2025.01)

(58) Field of Classification Search
CPC ........ H10D 1/20; H10D 1/716; H10D 84/038; H10D 84/201
See application file for complete search history.

(56) References Cited

U.S. PATENT DOCUMENTS

2022/0310582 A1* 9/2022 Obata .................. H03H 7/0115

FOREIGN PATENT DOCUMENTS

| JP | H09-213894 A | 8/1997 |
|---|---|---|
| JP | 2001-523050 A | 11/2001 |
| JP | 2002-057037 A | 2/2002 |
| JP | 2002-184945 A | 6/2002 |
| JP | 2002-190426 A | 7/2002 |

(Continued)

*Primary Examiner* — Yara B Green
*Assistant Examiner* — Christopher M Roland
(74) *Attorney, Agent, or Firm* — Studebaker Brackett PLLC

(57) ABSTRACT

An electronic component, an electronic circuit, and a method for manufacturing an electronic component. An electronic component includes a substrate having first and second main surfaces facing each other and containing a silicon element; a capacitor element on the first main surface; and an inductor element on the first or second main surfaces in a direction orthogonal to the first main surface with respect to the capacitor element and electrically connected to the capacitor element. The capacitor element includes a first electrode portion extending in a direction intersecting the first main surface between the first and second main surfaces; a second electrode portion that extends in the direction intersecting the first main surface between the first and second main surfaces, and faces the first electrode portion in a direction parallel to the first main surface; and a dielectric portion between the first and second electrode portions.

20 Claims, 16 Drawing Sheets

(56)          References Cited

FOREIGN PATENT DOCUMENTS

| JP | 2008-251972 A | 10/2008 |
| JP | 2020-107880 A | 7/2020 |
| JP | 2020-145475 A | 9/2020 |
| JP | 2021-068825 A | 4/2021 |

* cited by examiner 73
75
72
74
71

5

73
75
72
74
71

5

ELECTRONIC COMPONENT AND ELECTRONIC CIRCUIT COMPRISING A CAPACITOR AND AN INDUCTOR

CROSS-REFERENCE TO RELATED APPLICATION

This application claims benefit of priority to Japanese Patent Application No. 2022-012142, filed Jan. 28, 2022, the entire content of which is incorporated herein by reference.

BACKGROUND

Technical Field

The present disclosure relates to an electronic component, an electronic circuit, and a method for manufacturing an electronic component.

Background Art

Conventionally, as an electronic component, there is an electronic component described in Japanese Patent Application Laid-Open No. 2020-107880. An electronic component includes a magnetic layer, a nonmagnetic substrate, and an inductor and a capacitor disposed between the nonmagnetic substrate and the magnetic layer. The inductor and the capacitor are disposed on the upper surface of the magnetic layer.

SUMMARY

However, in the conventional electronic component, since the inductor and the capacitor are disposed on the same plane, there is a problem that a mounting area becomes large when a lower surface side of the magnetic layer is mounted on a mounting substrate.

Therefore, the present disclosure provides an electronic component, an electronic circuit, and a method for manufacturing an electronic component capable of reducing a mounting area.

An electronic component according to an aspect of the present disclosure includes a substrate having a first main surface and a second main surface facing each other and containing a silicon element; a capacitor element provided on the first main surface side of the substrate; and an inductor element provided on the first main surface or the second main surface of the substrate in a direction orthogonal to the first main surface with respect to the capacitor element and electrically connected to the capacitor element. The capacitor element includes a first electrode portion extending in a direction intersecting the first main surface between the first main surface and the second main surface and located on the substrate side; a second electrode portion that extends in the direction intersecting the first main surface between the first main surface and the second main surface, and faces the first electrode portion in a direction parallel to the first main surface; and a dielectric portion located between the first electrode portion and the second electrode portion. The inductor element includes an element body having a third main surface located on a side opposite to the substrate and containing a magnetic material; an inductor wire provided in the element body and extending in the direction parallel to the first main surface; and a vertical wire that is provided in the element body, is connected to an end of the inductor wire, and extends to the third main surface, and in which a thickness of the inductor wire is larger than a thickness of the second electrode portion.

Here, "on the main surface" refers to not an absolute direction such as vertically upward defined in the direction of gravity but a direction toward the outside between the outside and the inside of the substrate having the main surface as a boundary. Therefore, "on the main surface" is a relative direction determined by the direction of the main surface. In addition, "on" a certain element includes not only a position (on) immediately above the element in contact with the element but also an upper position (above) away from the element, that is, an upper position via another object on the element or an upper position with a space therebetween.

"The capacitor element is provided on the first main surface side of the substrate" means that the capacitor element is provided inside the substrate with respect to the first main surface of the substrate, and a part of the capacitor element may exist outside the substrate with respect to the first main surface of the substrate.

The "thickness of the inductor wire" refers to a length in the direction orthogonal to the first main surface. The "thickness of the second electrode portion" refers to a film thickness in a direction orthogonal to the film-like main surface when the second electrode portion has a film shape.

According to the above aspect, since the inductor element and the capacitor element are provided on different layers, when the main surface of the electronic component parallel to the first main surface is mounted as a mounting surface, the mounting area of the electronic component can be reduced.

In addition, since the thickness of the inductor wire can be increased, the resistance can be reduced, and the inductance acquisition efficiency can be improved. On the other hand, since the thickness of the second electrode portion can be reduced, the capacitance of the capacitor can be increased by overlapping a plurality of first electrode portions and a plurality of second electrode portions in a direction parallel to the first main surface while suppressing an increase in size of the electronic component.

Preferably, in an embodiment of the electronic component, the electronic component further includes a shield layer between the capacitor element and the inductor element, in which the shield layer includes a shield conductor layer extending in the direction parallel to the first main surface.

According to the above embodiment, when the magnetic flux passes through the capacitor element, the electric field of the capacitor element is varied, but since the shield conductor layer is included, the impedance can be suppressed from varying.

Preferably, in an embodiment of the electronic component, the thickness of the inductor wire is larger than a thickness of the shield conductor layer.

According to the above embodiment, by making the thickness of the inductor wire through which a larger direct current flows than that in the shield conductor layer sufficiently thick, the direct current resistance can be reduced.

Preferably, in an embodiment of the electronic component, the electronic component further includes a connection layer that connects the capacitor element and the inductor element between the capacitor element and the inductor element, in which the connection layer includes a connection conductor layer extending in the direction parallel to the first main surface, and in which the connection conductor layer does not go around more than one turn.

According to the above embodiment, since the connection conductor layer can be minimized, the area (volume) occupied by the capacitor element and the inductor element can be relatively increased, and the circuit constants of the capacitor element and the inductor element can be acquired.

Preferably, in an embodiment of the electronic component, the thickness of the inductor wire is larger than a thickness of the connection conductor layer.

According to the above embodiment, by making the thickness of the inductor wire through which a larger direct current flows than that in the connection conductor layer sufficiently thick, the direct current resistance can be reduced.

Preferably, in an embodiment of the electronic component, the capacitor element includes a vertical wire that is connected to the first electrode portion or the second electrode portion, extends to the third main surface through the element body, and is not connected to the inductor wire.

According to the above embodiment, the circuit constant of only the capacitor element can be acquired.

Preferably, in an embodiment of the electronic component, the thickness of the inductor wire is 10 times or more the thickness of the second electrode portion.

According to the above embodiment, by making the thickness of the inductor wire through which a larger direct current flows than that in the second electrode portion sufficiently thick, the direct current resistance can be further reduced. In addition, since the thickness of the second electrode portion can be sufficiently reduced, the capacitance of the capacitor can be further increased by overlapping a plurality of first electrode portions and a plurality of second electrode portions in a direction parallel to the first main surface while suppressing an increase in size of the electronic component.

Preferably, in an embodiment of the electronic component, a composition of the inductor wire is different from a composition of each of the first electrode portion and the second electrode portion.

According to the above embodiment, an appropriate material can be selected from the viewpoint of ease of manufacturing and element characteristics. For example, by using aluminum or polysilicon doped with impurities for the electrode portion, it is possible to improve the capacitance by microfabrication. In addition, by using silver or copper for the inductor wire, heat generation when a direct current flows can be suppressed.

Preferably, in an embodiment of the electronic component, the capacitor element has a thickness of 100 μm or less, the inductor element has a thickness of 200 μm or less, and the electronic component has a thickness of 300 μm or less.

Here, the thickness of each member is a length of the outer surface of each member in the direction orthogonal to the first main surface.

According to the above embodiment, it is possible to reduce the thickness of the electronic component.

Preferably, in an embodiment of the electronic component, at least one of the capacitor element and the inductor element is provided in plural.

According to the above embodiment, the characteristics of the electronic component can be adjusted.

Preferably, in an embodiment of the electronic component, the electronic component further includes a connection layer that connects the capacitor element and the inductor element between the capacitor element and the inductor element, in which the connection layer includes a first end surface on the inductor element side and a second end surface on the capacitor element side, and includes a vertical wire extending in the direction orthogonal to the first main surface. Also, an area of the first end surface is larger than an area of the second end surface.

According to the above embodiment, the electrical resistance on the inductor element side of the vertical wire through which a larger direct current flows than that on the capacitor element side of the vertical wire can be reduced.

Preferably, in an embodiment of the electronic component, the substrate has a groove portion into which the second electrode portion is inserted on the first main surface side, and the inductor element is located on a side opposite to an opening side of the groove portion with respect to the substrate.

According to the above embodiment, the capacitor element and the inductor element can be separated from each other, and interference between the capacitor element and the inductor element can be reduced.

Preferably, in an embodiment of the electronic component, the substrate has a groove portion into which the second electrode portion is inserted on the first main surface side, and the inductor element is located on an opening side of the groove portion with respect to the substrate.

According to the above embodiment, since the opening side of the groove portion of the capacitor element has the uneven shape, the inductor element is located on the opening side of the groove portion with respect to the substrate, so that the contact area of the capacitor element with the inductor element can be increased, and the mechanical strength between the elements can be improved. For example, separation between elements due to thermal stress such as a reflow load can be suppressed.

Preferably, in an embodiment of the electronic component, the substrate has a groove portion into which the second electrode portion is inserted on the first main surface side, and when viewed from the direction orthogonal to the first main surface, a shape of the first main surface of the substrate excluding the groove portion includes a plurality of polygons, and the number of vertices of the polygon is six or more.

Here, the polygon includes a polygon convex outward and a polygon concave inward. The vertex includes an intersection of two straight lines, a rounded curved point, and a concave bending point.

According to the above embodiment, the surface areas of remaining portions of the substrate excluding the groove portion can be increased, the surface area of the first electrode portion can be increased, and the capacitance of the capacitor element can be increased.

Preferably, in an embodiment of the electronic component, the first electrode portion is a porous metal layer provided on the first main surface or the second main surface, the porous metal layer has pores extending in the direction intersecting the first main surface, the dielectric portion is provided on an inner surface of the pore, and the second electrode portion is laminated on the dielectric portion.

According to the above embodiment, since the porous metal layer is provided, the surface areas of the first electrode portion and the dielectric portion can be increased, and the capacitance of the capacitor element can be increased.

Preferably, in an embodiment of the electronic component, an electrical resistivity of the substrate is 1 $\Omega \cdot$cm or less.

According to the above embodiment, by lowering the electrical resistivity of the substrate, the substrate itself can be used as a ground, and the stability of the ground can be improved.

Preferably, in an embodiment of the electronic component, in a section orthogonal to an extending direction of the inductor wire, the inductor wire has a top surface and a bottom surface parallel to the first main surface, and two side surfaces orthogonal to the first main surface, and at least one of the top surface and the bottom surface and the two side surfaces orthogonal to the first main surface are in contact with the element body.

According to the above embodiment, the volume of the element body can be increased, and the inductance can be improved.

Preferably, in an embodiment of an electronic circuit, the electronic circuit includes the electronic component; a switching element electrically connected to the inductor element; a ground electrically connected to the capacitor element; and a load element electrically connected to the inductor element and the capacitor element.

According to the above embodiment, a small DC-DC converter can be provided.

Preferably, in an embodiment of a method for manufacturing an electronic component, the method includes preparing a substrate having a first main surface and a second main surface facing each other and containing a silicon element; forming a capacitor element on the substrate using an inorganic material; and forming an inductor element on a layer different from the capacitor element on the first main surface or the second main surface by using an organic material, in which the forming the inductor element is performed after the forming the capacitor element.

According to the above embodiment, since the inductor element and the capacitor element are provided on different layers, the mounting area of the electronic component can be reduced.

In addition, since the capacitor element is first formed using the inorganic material remaining even after firing, and then the inductor element is formed using the organic material scattered by heat, an unnecessary thermal load is not applied to the inductor element. As a result, it is possible to manufacture an electronic component capable of improving quality.

According to the electronic component, the electronic circuit, and the method for manufacturing an electronic component according to an aspect of the present disclosure, the mounting area can be reduced.

DETAILED DESCRIPTION

Hereinafter, an electronic component, an electronic circuit, and a method for manufacturing an electronic component, which are one aspect of the present disclosure, will be described in detail with reference to the illustrated embodiments. Note that the drawings include some schematic drawings, and may not reflect actual dimensions and ratios.

First Embodiment

[Overview Configuration]

Figure 1:
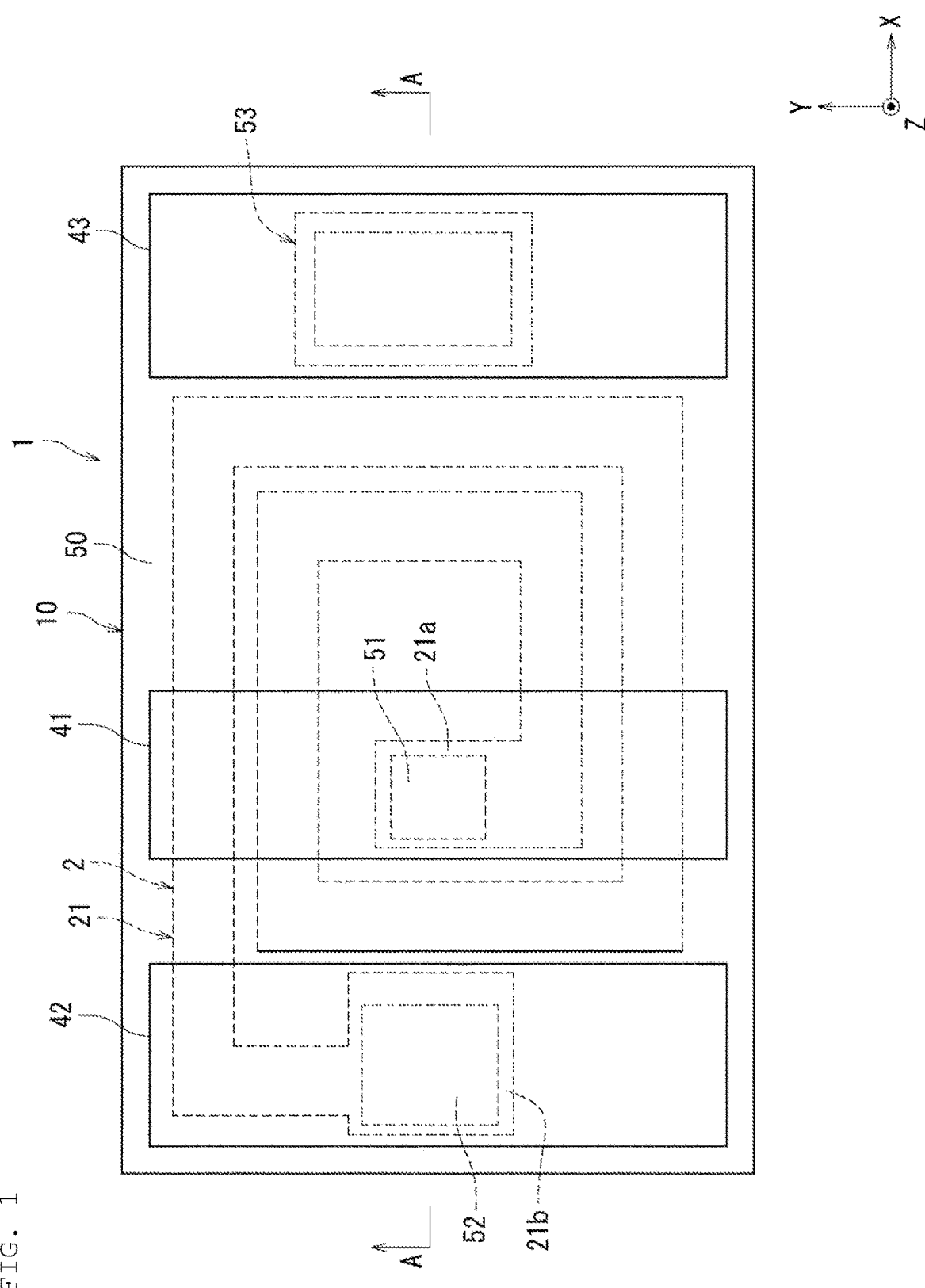
FIG. 1 is a plan view illustrating a first embodiment of an electronic component.
Figure 2:
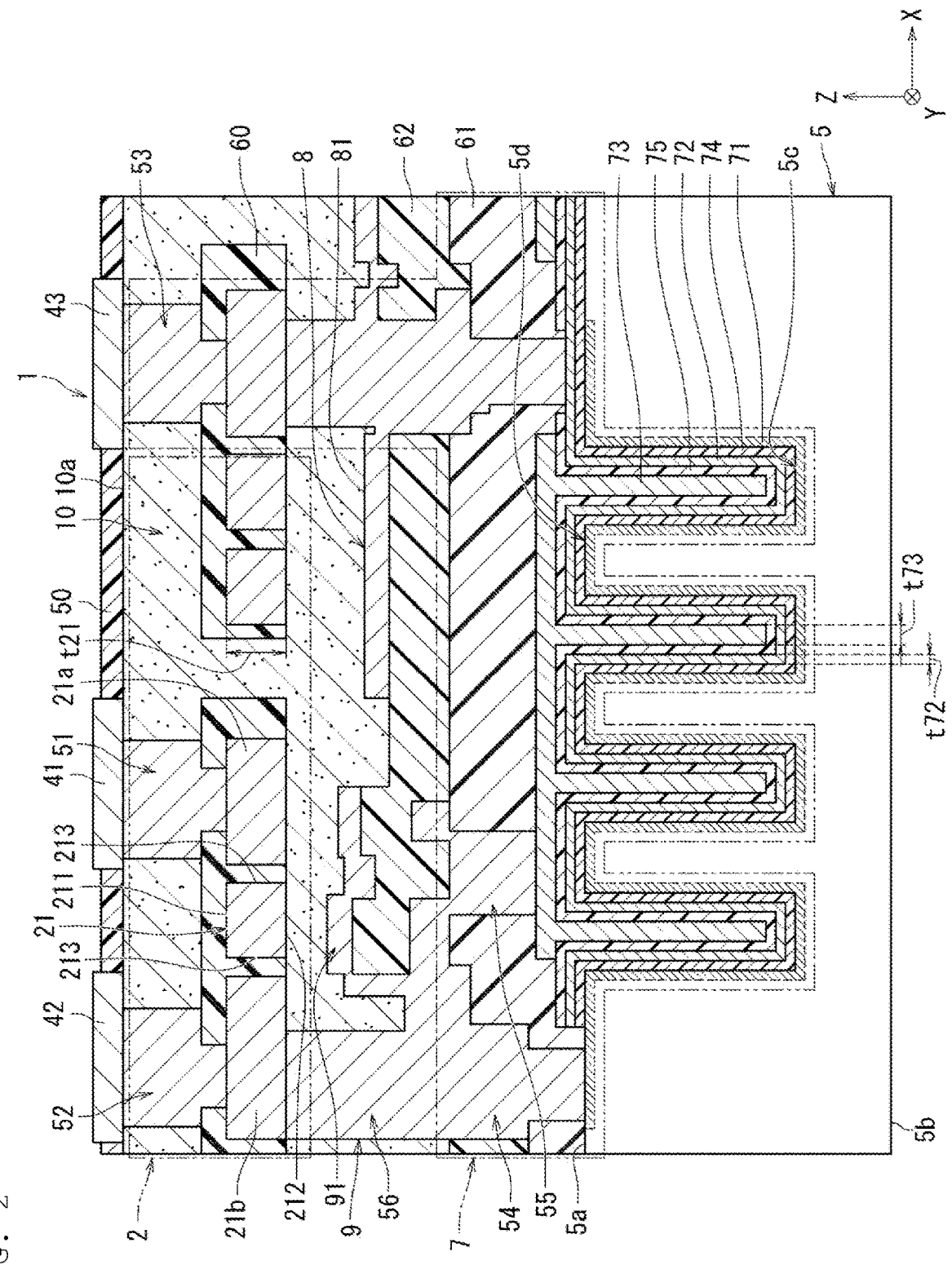
FIG. 2 is a sectional view taken along line A-A of FIG. 1.
Figure 3:
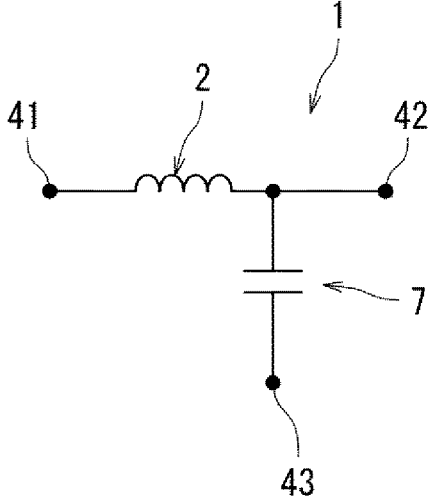
FIG. 3 is an equivalent circuit diagram of the first embodiment of the electronic component.

FIG. 1 is a plan view illustrating a first embodiment of an electronic component. FIG. 2 is a sectional view taken along line A-A of FIG. 1. FIG. 3 is an equivalent circuit diagram of the first embodiment of the electronic component. As illustrated in FIGS. 1, 2, and 3, an electronic component 1 includes a substrate 5, a capacitor element 7, and an inductor element 2.

The substrate 5 contains a silicon element. The substrate 5 has a first main surface 5a and a second main surface 5b facing each other. The capacitor element 7 is provided on the first main surface 5a side of the substrate 5. The inductor element 2 is provided on the first main surface 5a of the substrate 5 in a direction orthogonal to the first main surface 5a with respect to the capacitor element 7, and is electrically connected to the capacitor element 7. The inductor element 2 is located on the capacitor element 7. In FIG. 1, each of the inductor element 2 and the capacitor element 7 schematically shows a range surrounded by a two-dot chain line frame.

The capacitor element 7 includes a first electrode portion 71, a second electrode portion 72, and a first dielectric portion 74. The first electrode portion 71 extends in a direction intersecting the first main surface 5a between the first main surface 5a and the second main surface 5b, and is located on the substrate 5 side. The second electrode portion 72 extends in a direction intersecting the first main surface 5a between the first main surface 5a and the second main surface 5b, and faces the first electrode portion 71 in a direction parallel to the first main surface 5a. The first dielectric portion 74 is located between the first electrode portion 71 and the second electrode portion 72. The capacitor element 7 is provided inside the substrate 5 with respect to the first main surface 5a of the substrate 5, and a part of the capacitor element 7 exists outside the substrate 5 with respect to the first main surface 5a of the substrate 5.

The inductor element 2 includes an element body 10, an inductor wire 21, a first vertical wire 51, and a second vertical wire 52. The element body 10 includes a magnetic material. The element body 10 has a third main surface 10a located on the side opposite to the substrate 5. The inductor wire 21 is provided in the element body 10 and extends in a direction parallel to the first main surface 5a. Each of the first vertical wire 51 and the second vertical wire 52 is provided in the element body 10, is connected to an end of the inductor wire 21, and extends to the third main surface 10a.

The thickness t21 of the inductor wire 21 is larger than the thickness t72 of the second electrode portion 72. The thickness t21 of the inductor wire 21 refers to a length in a direction orthogonal to the first main surface 5a. The thickness t72 of the second electrode portion 72 refers to a film thickness in a direction orthogonal to the film-like main surface because the second electrode portion 72 has a film shape.

According to the above configuration, since the inductor element 2 and the capacitor element 7 are provided on different layers, when the main surface of the electronic component 1 parallel to the first main surface 5a is mounted as a mounting surface, the mounting area of the electronic component 1 can be reduced. The mounting surface is on the third main surface 10a side.

In addition, since the thickness t21 of the inductor wire 21 can be increased, the resistance can be reduced, and the inductance acquisition efficiency can be improved. On the other hand, since the thickness t72 of the second electrode portion 72 can be reduced, the capacitance of the capacitor can be increased by overlapping a plurality of first electrode portions 71 and a plurality of second electrode portions 72 in a direction parallel to the first main surface 5a while suppressing an increase in size of the electronic component 1.

Although the inductor element 2 is provided on the first main surface 5a of the substrate 5, the inductor element 2 may be provided on the second main surface 5b of the substrate 5.

The mounting surface is on the third main surface 10a side, but may be on the second main surface 5b side. Alternatively, the mounting surfaces may be on both the third main surface 10a side and the second main surface 5b side, and the electronic components 1 can be simultaneously mounted on the two components.

In addition, the electronic component 1 may be embedded in the mounting substrate, and in this case, the first vertical wire 51 and the second vertical wire 52 may be used as external terminals.

In addition, at least one of the capacitor element 7 and the inductor element 2 may be provided in plural. According to this, the characteristics of the electronic component 1 can be adjusted.

[Preferred Configuration of Each Member]

(Electronic Component 1)

The electronic component 1 is mounted on an electronic device such as a personal computer, a DVD player, a digital camera, a TV, a mobile phone, or car electronics, for example. The electronic component 1 includes the substrate 5, the inductor element 2, the capacitor element 7, a shield layer 8, a connection layer 9, a first external terminal 41, a second external terminal 42, and a third external terminal 43.

The shield layer 8 and the connection layer 9 are disposed between the inductor element 2 and the capacitor element 7. The shield layer 8 reduces the flow of the magnetic flux of the inductor element 2 toward the capacitor element 7. The connection layer 9 electrically connects the capacitor element 7 and the inductor element 2.

A first end 21a of the inductor wire 21 of the inductor element 2 is connected to the first external terminal 41 via the first vertical wire 51. A second end 21b of the inductor wire 21 of the inductor element 2 is connected to the second external terminal 42 via the second vertical wire 52.

A first end of the capacitor element 7 is connected to the second end 21b of the inductor wire 21 via the connection layer 9. A second end of the capacitor element 7 is connected to the third external terminal 43. In this manner, the inductor element 2 and the capacitor element 7 are connected in series to constitute an LC resonance circuit.

In the drawing, a thickness direction of the electronic component 1 is defined as a Z direction, a forward Z direction is defined as an upper side, and a reverse Z direction is defined as a lower side. In a plane orthogonal to the Z direction of the electronic component 1, a length direction that is a longitudinal direction of the electronic component 1 and is a direction in which the first external terminal 41, the second external terminal 42, and the third external terminal 43 are arranged is defined as an X direction, and a width direction of the electronic component 1 that is a direction orthogonal to the length direction is defined as a Y direction.

(Inductor Element 2)

The inductor element 2 includes the element body 10, the inductor wire 21 disposed in the element body 10, a non-magnetic insulator 60 covering at least a part of the inductor wire 21, and the first vertical wire 51 and the second vertical wire 52 provided in the element body 10 such that end surfaces are exposed from the third main surface 10a of the element body 10. The first external terminal 41, the second external terminal 42, and the third external terminal 43 are disposed on the third main surface 10a of the element body 10, and a coating film 50 for exposing the first external terminal 41, the second external terminal 42, and the third external terminal 43 is provided on the third main surface 10a of the element body 10.

The element body 10 includes a magnetic layer, and the magnetic layer includes magnetic powder and a resin containing the magnetic powder. The resin is, for example, an organic insulating material including an epoxy-based resin, a phenol-based resin, a liquid crystal polymer-based resin, a polyimide-based resin, an acrylic resin, or a mixture containing them. The magnetic powder is, for example, an FeSi-based alloy such as FeSiCr, an FeCo-based alloy, an Fe-based alloy such as NiFe, or an amorphous alloy thereof. Therefore, as compared with a magnetic layer made of ferrite, the DC superposition characteristics can be improved by the magnetic powder, and the magnetic powder is insulated from each other by the resin, so that the loss (iron loss) at high frequency is reduced. Note that the magnetic layer may not contain an organic resin such as ferrite or a sintered body of magnetic powder.

The inductor wire 21 is a wire extending in a spiral shape along the first main surface 5a. The number of turns of the inductor wire 21 preferably exceeds 1 turn. Accordingly, the inductance can be improved. For example, the inductor wire 21 is spirally wound in the counterclockwise direction from the first end 21a which is the inner peripheral end toward the second end 21b which is the outer peripheral end when viewed from the Z direction.

The first end 21a of the inductor wire 21 is connected to the first external terminal 41 via the first vertical wire 51 in contact with the upper surface of the first end 21a. The second end 21b of the inductor wire 21 is connected to the second external terminal 42 via the second vertical wire 52 in contact with the upper surface of the second end 21b. The inductor wire 21 may be provided in plural along the Z direction, and the plurality of inductor wires 21 may be connected in series.

The thickness of the inductor wire 21 is preferably, for example, 40 μm or more and 120 μm or less (i.e., from 40 μm to 120 μm). As an example of the inductor wire 21, the thickness is 30 μm, and the wire width is 45 μm. The inductor wire 21 is made of a conductive material, for example, a low electric resistance metal material such as Cu, Ag, Au, or Al. The inductor wire may have a two-layer structure of a seed layer and an electrolytic plating layer, or may contain Ti or Ni as the seed layer.

In a section orthogonal to the extending direction of the inductor wire 21, the inductor wire 21 has a top surface 211 and a bottom surface 212 parallel to the first main surface 5a, and two side surfaces 213 orthogonal to the first main surface 5a. The top surface 211 is located in the forward Z direction, and the bottom surface 212 is located in the reverse Z direction. The top surface 211 and the two side surfaces 213 are in contact with the insulator 60. The bottom surface 212 is in contact with the magnetic layer of the element body 10.

The first vertical wire 51 is made of a conductive material, extends in the Z direction from the upper surface of the inductor wire 21, and penetrates the inside of the element body 10. The first vertical wire 51 includes a via wire provided on the upper surface of the first end 21a of the inductor wire 21 and penetrating the inside of the insulator 60, and a columnar wire extending in the forward Z direction from the upper surface of the via wire, penetrating the inside of the element body 10, and having an end surface exposed to the third main surface 10a of the element body 10. The via wire is a conductor having a line width (diameter and sectional area) smaller than that of the columnar wire.

The second vertical wire 52 has the same configuration as the first vertical wire 51. That is, the second vertical wire 52 includes a via wire provided on the upper surface of the second end 21b of the inductor wire 21 and penetrating the inside of the insulator 60, and a columnar wire extending in the forward Z direction from the upper surface of the via wire, penetrating the inside of the element body 10, and having an end surface exposed to the third main surface 10a of the element body 10.

Each of the first external terminal 41, the second external terminal 42, and the third external terminal 43 is made of a conductive material, and has, for example, a three-layer configuration in which Cu having low electric resistance and excellent stress resistance, Ni having excellent corrosion resistance, and Au having excellent solder wettability and reliability are arranged in this order from the inside to the outside. The thickness of each layer of Cu/Ni/Au is, for example, 5/5/0.01 μm.

The insulator 60 is made of an insulating material containing no magnetic body. The insulator 60 is, for example, an organic resin such as an epoxy resin, a phenol resin, a polyimide resin, a liquid crystal polymer, or a combination thereof, a sintered body such as glass or alumina, a thin film such as a silicon oxide film, a silicon nitride film, or a silicon oxynitride film, or the like.

(Capacitor Element 7)

The capacitor element 7 includes the first electrode portion 71, the second electrode portion 72, the third electrode portion 73, the first dielectric portion 74, a second dielectric portion 75, a third vertical wire 53, a fourth vertical wire 54, and a fifth vertical wire 55.

The first electrode portion 71 extends in a direction orthogonal to the first main surface 5a between the first main surface 5a and the second main surface 5b, and is located closest to the substrate 5. The first electrode portion 71 is formed in a meander shape extending in the X direction while being folded back in the Z direction in the XZ section of FIG. 2. The first electrode portion 71 is a doped layer formed by doping the first main surface 5a of the substrate 5 with impurities. That is, the first electrode portion 71 is also a part of the substrate 5. The first electrode portion 71 may be a thin film of a metal material. That is, the thin film first electrode portion 71 may be formed on the substrate 5 by, for example, chemical vapor deposition (CVD), atomic layer deposition (ALD), sputtering, or the like.

The second electrode portion 72 extends in a direction intersecting the first main surface 5a between the first main surface 5a and the second main surface 5b, and faces the first electrode portion 71 in a direction orthogonal to the first main surface 5a. The second electrode portion 72 is formed in a meander shape extending in the X direction while being folded back in the Z direction in the XZ section of FIG. 2. The second electrode portion 72 is formed along the first electrode portion 71. The second electrode portion 72 is a thin film of a metal material. The second electrode portion 72 is formed by using, for example, chemical vapor deposition, atomic layer deposition, sputtering, or the like.

The third electrode portion 73 extends in a direction intersecting the first main surface 5a between the first main surface 5a and the second main surface 5b, and faces the second electrode portion 72 in a direction orthogonal to the first main surface 5a. The third electrode portion 73 has a plurality of tooth portions extending in the Z direction in the XZ section of FIG. 2, and is formed in a comb shape in which the plurality of tooth portions are arranged side by side in the X direction. The tooth portions of the third electrode portion 73 are inserted into the fold-back gaps of the second electrode portion 72. The third electrode portion 73 is a thin film of a metal material. The third electrode portion 73 is formed by using, for example, chemical vapor deposition, atomic layer deposition, sputtering, or the like.

The composition of each of the first electrode portion 71, the second electrode portion 72, and the third electrode portion 73 is different from the composition of the inductor wire 21. According to this, an appropriate material can be selected from the viewpoint of ease of manufacturing and element characteristics. For example, by using aluminum or polysilicon doped with impurities for the first electrode portion 71, the second electrode portion 72, and the third electrode portion 73, it is possible to improve the capacitance by microfabrication. In addition, by using silver or copper for the inductor wire 21, heat generation when a direct current flows can be suppressed.

The first dielectric portion 74 is located between the first electrode portion 71 and the second electrode portion 72. The first dielectric portion 74 is formed along the first electrode portion 71. The second dielectric portion 75 is located between the second electrode portion 72 and the third electrode portion 73. The second dielectric portion 75 is formed along the second electrode portion 72. The first dielectric portion 74 and the second dielectric portion 75 are thin films of dielectric materials. The first dielectric portion 74 and the second dielectric portion 75 are formed by using, for example, chemical vapor deposition, atomic layer deposition, or the like.

The first electrode portion 71 is connected to the fourth vertical wire 54, and the fourth vertical wire 54 is connected to the connection layer 9. As a result, the first electrode portion 71 is electrically connected to the second end 21*b* of the inductor wire 21 and is electrically connected to the second external terminal 42.

The third electrode portion 73 is connected to the fifth vertical wire 55, and the fifth vertical wire 55 is connected to the connection layer 9. As a result, the third electrode portion 73 is electrically connected to the second end 21*b* of the inductor wire 21 and is electrically connected to the second external terminal 42.

The second electrode portion 72 is connected to the third vertical wire 53, and the third vertical wire 53 is connected to the third external terminal 43. Thus, the second electrode portion 72 is electrically connected to the third external terminal 43. Therefore, by applying a voltage to the second external terminal 42 and the third external terminal 43, a capacitance can be formed between the first electrode portion 71 and the second electrode portion 72, and a capacitance can be formed between the second electrode portion 72 and the third electrode portion 73.

A first insulating layer 61 is laminated on the upper surface of the third electrode portion 73, and a second insulating layer 62 is laminated on the upper surface of the first insulating layer 61. The element body 10 is laminated on the upper surface of the second insulating layer 62. The materials of the first insulating layer 61 and the second insulating layer 62 are the same as the material of the insulator 60.

The third vertical wire 53 is connected to the upper surface of the second electrode portion 72, penetrates the first insulating layer 61 and the second insulating layer 62 and the inside of the element body 10, and extends to the third main surface 10*a* of the element body 10 in the Z direction. The third vertical wire 53 includes a columnar wire, a via wire, and a connection wire that is not connected to the inductor wire 21 in the same layer as the inductor wire 21. That is, the third vertical wire 53 is not electrically connected to the inductor wire 21. Therefore, the circuit constant of only the capacitor element 7 can be acquired.

The fourth vertical wire 54 is connected to the upper surface of the first electrode portion 71, penetrates the insides of the first insulating layer 61 and the second insulating layer 62, and extends to the connection layer 9 in the Z direction. The fifth vertical wire 55 is connected to the upper surface of the third electrode portion 73, penetrates the inside of the first insulating layer 61, and extends to the connection layer 9 in the Z direction.

The third vertical wire 53 may be connected to the first electrode portion 71 instead of the second electrode portion 72. At this time, the second electrode portion 72 is connected to the fourth vertical wire 54, and the third electrode portion 73 is connected to the third vertical wire 53.

(Shield Layer 8)

The shield layer 8 includes a part of the second insulating layer 62 and a shield conductor layer 81 provided on the upper surface of the second insulating layer 62. The shield conductor layer 81 has a flat plate shape extending in a direction parallel to the first main surface 5*a*, and is disposed so as to cover the upper side of the capacitor element 7. Therefore, when the magnetic flux passes through the capacitor element 7, the electric field of the capacitor element 7 is varied, but since the shield conductor layer 81 is included, the impedance can be suppressed from varying.

The material of the shield conductor layer 81 is the same as the material of the inductor wire 21, and the shield conductor layer 81 is made of, for example, a copper wire. When viewed from the direction perpendicular to the first main surface 5*a*, specifically, the Z direction, the higher the ratio of the shield conductor layer 81 (copper wire) in the shield layer 8, the higher the shielding effect. Therefore, the ratio of the area of the shield conductor layer 81 in the shield layer 8 viewed from the Z direction is preferably 80% or more. In addition, the shield layer 8 preferably covers a region where the density of the magnetic flux generated by the inductor element 2 is high, and for example, preferably covers a lower portion of an inner peripheral region surrounded by the inductor wire 21.

(Connection Layer 9)

The connection layer 9 includes a part of the second insulating layer 62, a connection conductor layer 91, and a sixth vertical wire 56. The connection conductor layer 91 extends in a direction parallel to the first main surface 5*a*. The connection conductor layer 91 does not go around more than one turn. Therefore, since the connection conductor layer 91 can be minimized, the area (volume) occupied by the capacitor element 7 and the inductor element 2 can be relatively increased, and the circuit constants of the capacitor element 7 and the inductor element 2 can be acquired.

The sixth vertical wire 56 extends in a direction orthogonal to the first main surface 5*a*. The sixth vertical wire 56 is connected between the second end 21*b* of the inductor wire 21 and the fourth vertical wire 54 of the capacitor element 7.

The sixth vertical wire 56 includes a first end surface on the inductor element 2 side and a second end surface on the capacitor element 7 side. Specifically, the first end surface is connected to the second end 21*b* of the inductor wire 21, and the second end surface is connected to the fourth vertical wire 54.

Preferably, the area of the first end surface is larger than the area of the second end surface. With this configuration, the electrical resistance on the inductor element 2 side of the sixth vertical wire 56 through which a larger direct current flows than that on the capacitor element 7 side of the sixth vertical wire 56 can be reduced.

Here, the area of the first end surface can be made larger than the area of the second end surface by, for example, forming a through hole through which the sixth vertical wire 56 penetrates from the inductor element 2 side by laser processing in the manufacture of the electronic component 1. That is, the capacitor element 7, the connection layer 9, and the inductor element 2 are laminated in this order.

Therefore, even when the inductor element 2 contains a large amount of organic resin, the inductor element 2 can be manufactured in the order from the capacitor element 7, so that the inductor element 2 can be manufactured with a reduced thermal load.

(Substrate 5)

The substrate 5 is a silicon substrate containing a silicon element. Preferably, the electrical resistivity of the substrate 5 is 1 Ω·cm or less. According to this, by lowering the electrical resistivity of the substrate 5, the substrate 5 itself can be used as a ground, and the stability of the ground can be improved.

Here, when the first electrode portion 71 which is a doped layer is formed by doping the substrate 5 with impurities, for example, doping the silicon substrate 5 with an impurity of a group III or a group V at a concentration of $1 \times 10^{16}/cm^3$ or more can reduce the electrical resistivity of the substrate 5, and the doped layer can be used as a conductor.

The first electrode portion 71 is a part of the capacitor element 7, but the first electrode portion 71 is also a part of the substrate 5 because it is a doped layer of the substrate 5. Hereinafter, the first electrode portion 71 will be described as a part of the substrate 5. When the first electrode portion 71 is not a doped layer but a thin film of a metal material provided on the substrate 5, the first electrode portion 71 is not a part of the substrate 5.

Figure 4A:
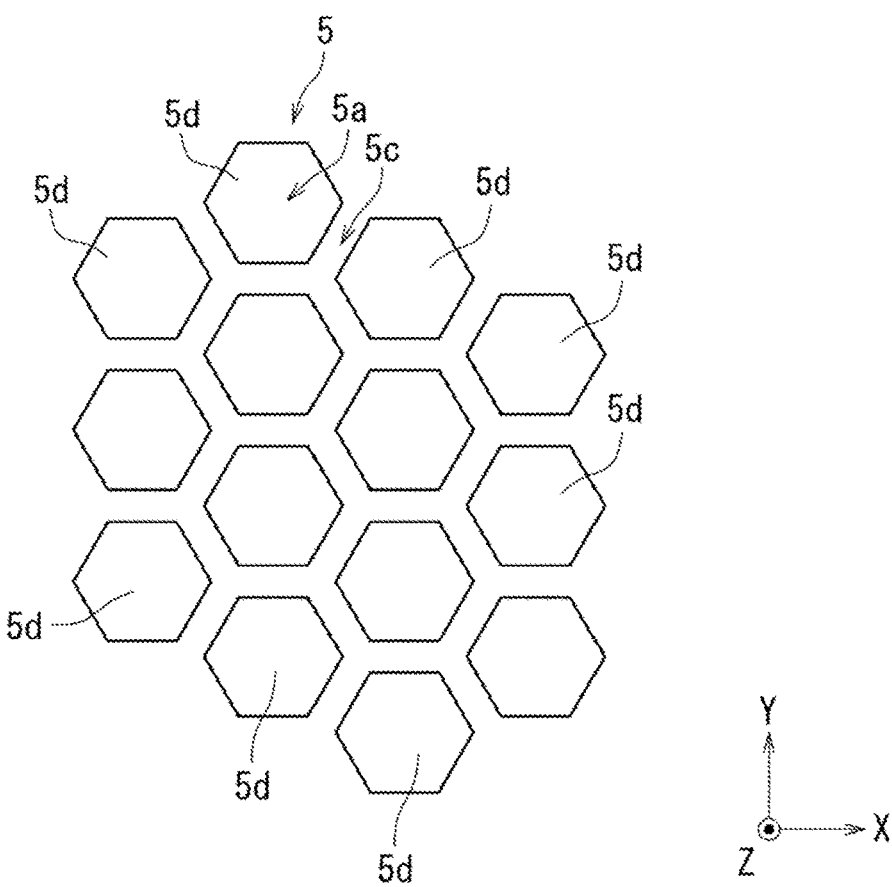
FIG. 4A is a plan view of a substrate as viewed from a first main surface side.

FIG. 4A is a plan view of the substrate 5 as viewed from the first main surface 5a side. As illustrated in FIGS. 2 and 4A, the substrate 5 has a groove portion 5c into which the second electrode portion 72 is inserted on the first main surface 5a side. When viewed from a direction orthogonal to the first main surface 5a, a shape of the first main surface 5a of the substrate 5 excluding the groove portion 5c is formed of a plurality of polygons, and the number of vertices of the polygon is six or more.

Specifically, the substrate 5 has remaining portions 5d excluding the groove portion 5c. A plurality of remaining portions 5d are provided. The groove portion 5c is formed between the adjacent remaining portions 5d. The remaining portion 5d is formed in a hexagonal prism. The shape of the remaining portion 5d is a hexagon when viewed from the direction orthogonal to the first main surface 5a. The hexagon is a hexagon convex outward. As described above, the shape of the first main surface 5a of the substrate 5 excluding the groove portion 5c is formed of a plurality of hexagons.

According to the above configuration, the surface areas of the remaining portions 5d of the substrate 5 excluding the groove portion 5c can be increased, the surface area of the first electrode portion 71 can be increased, and the capacitance of the capacitor element 7 can be increased.

Figure 4B:
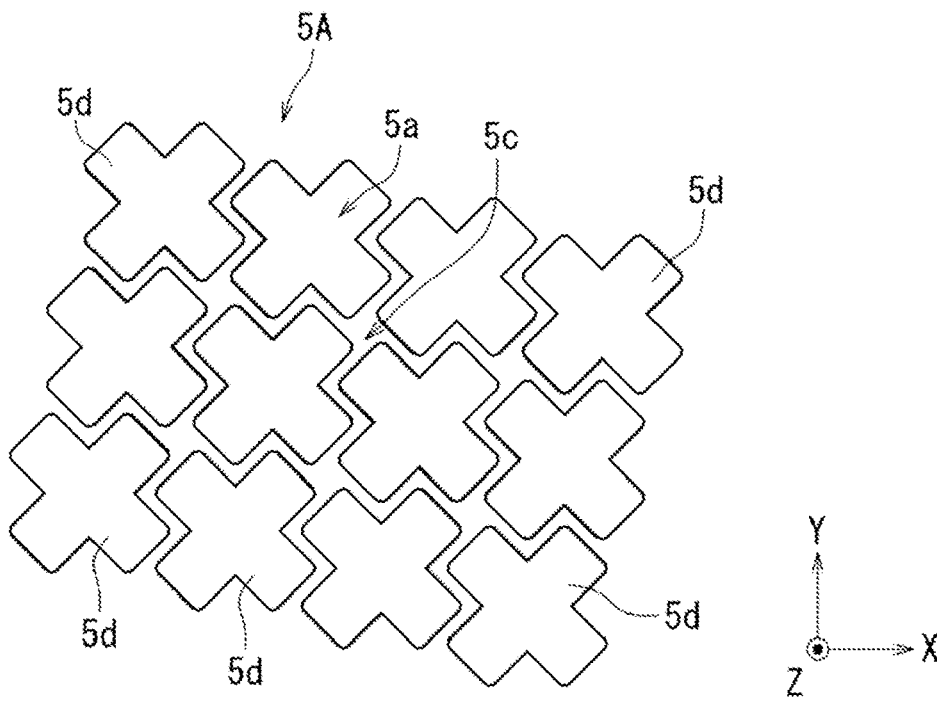
FIG. 4B is a plan view of another substrate as viewed from the first main surface side.

FIG. 4B is a plan view of another substrate 5A as viewed from the first main surface 5a side. As illustrated in FIG. 4B, when viewed from the direction orthogonal to the first main surface 5a, the shape of the remaining portions 5d of the substrate 5A excluding the groove portion 5c is a dodecagon. The dodecagon is a dodecagon in which a part thereof is concave inward. As described above, the shape of the first main surface 5a of the substrate 5 excluding the groove portion 5c is formed of a plurality of dodecagons. The shape of the remaining portion 5d may be another polygon having six or more vertices when viewed from the direction orthogonal to the first main surface 5a.

As illustrated in FIG. 2, the inductor element 2 is located on the opening side of the groove portion 5c with respect to the substrate 5. According to this, since the opening side of the groove portion 5c of the capacitor element 7 has the uneven shape, the inductor element 2 is located on the opening side of the groove portion 5c with respect to the substrate 5, so that the contact area of the capacitor element 7 with the inductor element 2 can be increased, and the mechanical strength between the elements can be improved. For example, separation between elements due to thermal stress such as a reflow load can be suppressed.

Figure 5:
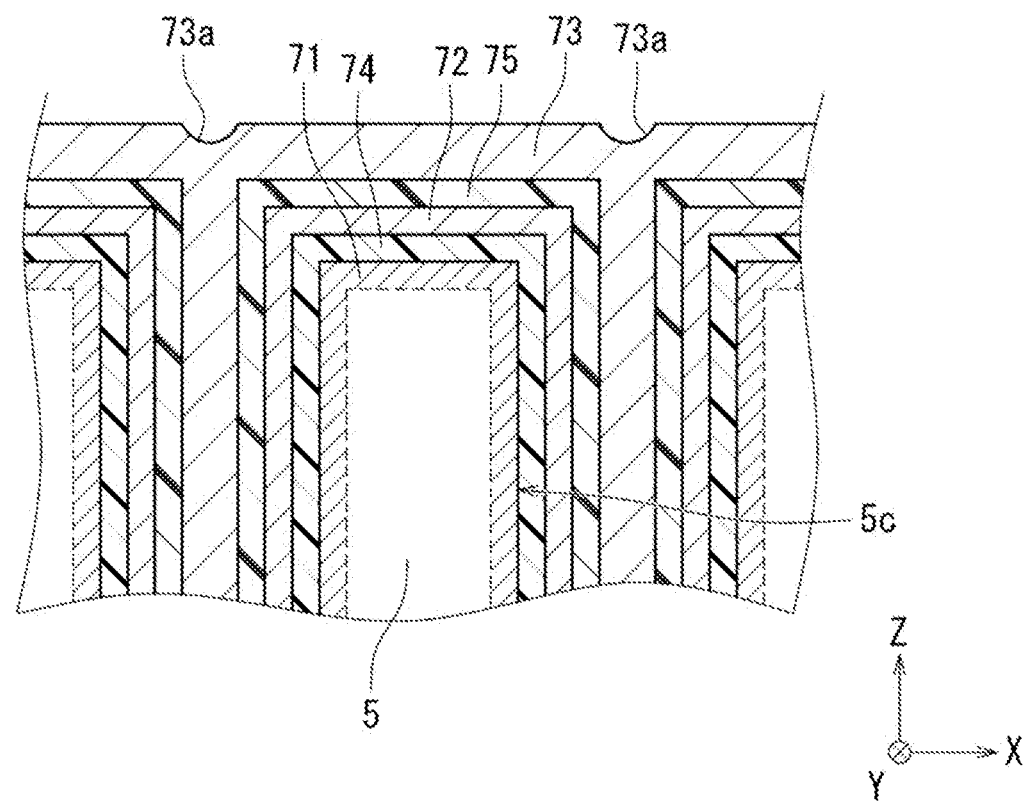
FIG. 5 is an enlarged view of a part of FIG. 2.

FIG. 5 is an enlarged view of a part of FIG. 2. As illustrated in FIG. 5, since the third electrode portion 73 is inserted into the groove portion 5c of the substrate 5, recesses 73a are formed on the upper surface of the third electrode portion 73 overlapping the groove portion 5c. Since the first insulating layer 61 and the second insulating layer 62 are thin films, the recesses 73a are transferred to the upper surface of each of the first insulating layer 61 and the second insulating layer 62 overlapping the recesses 73a. That is, the recesses are formed on the upper surface of the second insulating layer 62, and the contact area between the element body 10 and the second insulating layer 62 increases. This improves adhesion between the inductor element 2 and the capacitor element 7.

The depth of the recess 73a is, for example, 1 μm or more and 4 μm or less (i.e., from 1 μm to 4 μm). Preferably, the depth of the recess 73a is in a range of 0.5 times or more and 3 times or less (i.e., from 0.5 times to 3 times) the thickness t73 of the third electrode portion 73. When the depth of the recess 73a is small, improvement in mechanical strength (adhesion) between elements is small, and when the depth of the recess 73a is large, disconnection or the like may occur in the third electrode portion 73.

(Thickness of Each Member)

The thickness t21 of the inductor wire 21 is larger than the thickness t72 of the second electrode portion 72. As a result, since the thickness t21 of the inductor wire 21 can be increased, the resistance can be reduced, and the inductance acquisition efficiency can be improved. On the other hand, since the thickness t72 of the second electrode portion 72 can be reduced, the capacitance of the capacitor can be increased by overlapping a plurality of first electrode portions 71 and a plurality of second electrode portions 72 in a direction parallel to the first main surface 5a while suppressing an increase in size of the electronic component 1.

Here, in consideration of a case where the first electrode portion 71 is a doped layer of the substrate 5 and a boundary between the doped layer and the undoped layer cannot be determined in the substrate 5, the thickness t72 of the second electrode portion 72 rather than the thickness of the first electrode portion 71 is compared with the thickness t21 of the inductor wire 21.

The thickness of each of the electrode portion and the inductor wire is measured from a scanning electron microscope (SEM) image of a section of a central portion in the Y direction of the electronic component unless otherwise specified. At this time, the SEM image is acquired at a magnification of, for example, 1000 times. The SEM image as described above is acquired at five positions from the section, the thickness of each of the SEM images is measured, and the average value thereof is calculated as the thickness. In addition, in a case where the electrode portion and the inductor wire are laminated in multiple layers, the average values of the respective layers are defined as the respective thicknesses.

Preferably, the thickness t21 of the inductor wire 21 is 10 times or more the thickness t72 of the second electrode portion 72. For example, the inductor wire 21 is a copper wire having a thickness of 50 μm, and the second electrode portion 72 is a polysilicon wire having a thickness of 2 μm.

According to this, by making the thickness of the inductor wire 21 through which a larger direct current flows than that in the second electrode portion 72 sufficiently thick, the direct current resistance can be reduced. In addition, since the thickness t72 of the second electrode portion 72 can be sufficiently reduced, the capacitance of the capacitor can be further increased by overlapping a plurality of first electrode portions 71 and a plurality of second electrode portions 72 in a direction parallel to the first main surface 5a while suppressing an increase in size of the electronic component 1.

Preferably, the thickness t21 of the inductor wire 21 is larger than the thickness t73 of the third electrode portion 73. Accordingly, since the thickness t73 of the third electrode portion 73 can be reduced, the capacitance of the capacitor can be increased by overlapping a plurality of second electrode portions 72 and a plurality of third electrode portions 73 in a direction parallel to the first main surface 5a while suppressing an increase in size of the electronic component 1.

Preferably, the thickness t21 of the inductor wire 21 is larger than the thickness of the shield conductor layer 81. According to this, by making the thickness of the inductor wire 21 through which a larger direct current flows than that in the shield conductor layer 81 sufficiently thick, the direct current resistance can be reduced.

Preferably, the thickness t21 of the inductor wire 21 is larger than the thickness of the connection conductor layer 91. According to this, by making the thickness of the inductor wire 21 through which a larger direct current flows than that in the connection conductor layer 91 sufficiently thick, the direct current resistance can be reduced.

Preferably, the thickness of the capacitor element 7 is 100 μm or less, the thickness of the inductor element 2 is 200 μm or less, and the thickness of the electronic component 1 is 300 μm or less. The thickness of the capacitor element 7 is a length in the Z direction from the lower surface of the first electrode portion 71 to the upper surface of the first insulating layer 61. The thickness of the inductor element 2 is a length in the Z direction from the lower surface of the inductor wire 21 to the upper surface (third main surface 10a) of the element body 10. The thickness of the electronic component 1 is a length of the electronic component 1 in the Z direction. According to this, it is possible to reduce the thickness of the electronic component 1.

[Manufacturing Method]

Figure 6A:
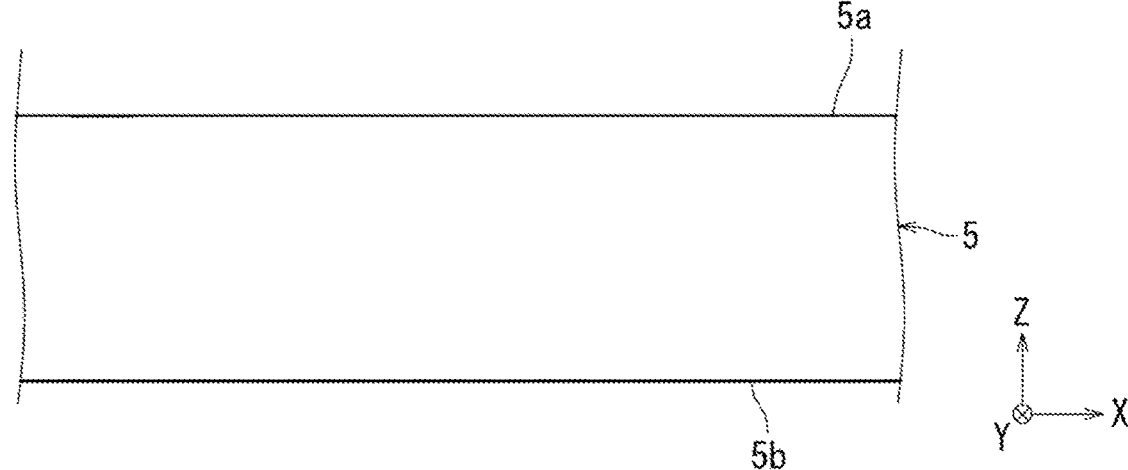
FIG. 6A is an explanatory view for explaining a manufacturing method of the electronic component.
Figure 6B:
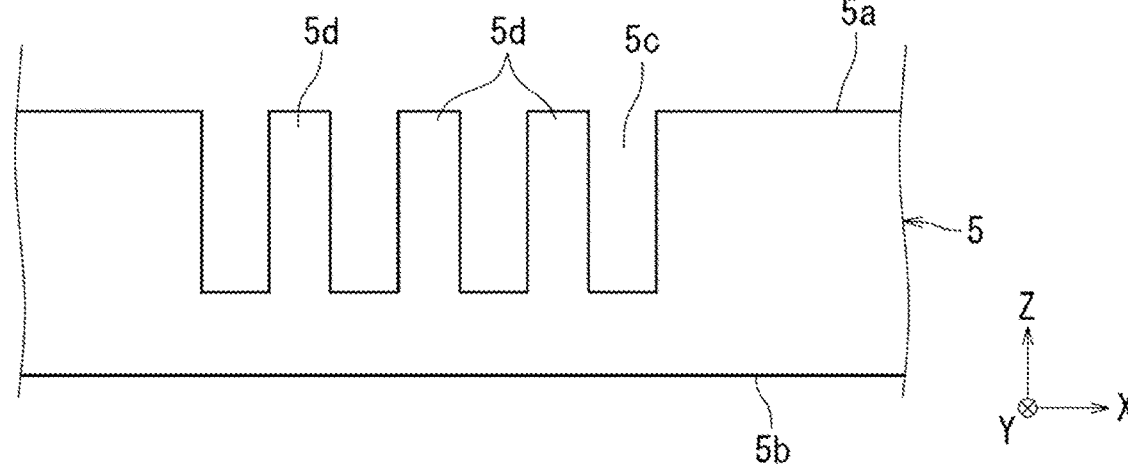
FIG. 6B is an explanatory view for explaining the manufacturing method of the electronic component.

Next, a method for manufacturing the electronic component 1 will be described. FIGS. 6A to 6Q correspond to the A-A section (FIG. 2) of FIG. 1.

As illustrated in FIG. 6A, a substrate 5 having a first main surface 5a and a second main surface 5b facing each other and containing a silicon element is prepared. The substrate 5 is a silicon substrate. Although not illustrated, a film to be a hard mask is formed on the first main surface 5a, and the film is patterned to form a hard mask. Then, the hard mask is removed after silicon deep etching (Bosch method) is performed. Consequently, as illustrated in FIG. 6B, the groove portion 5c and the remaining portions 5d are formed in the first main surface 5a of the substrate 5.

Figure 6C:
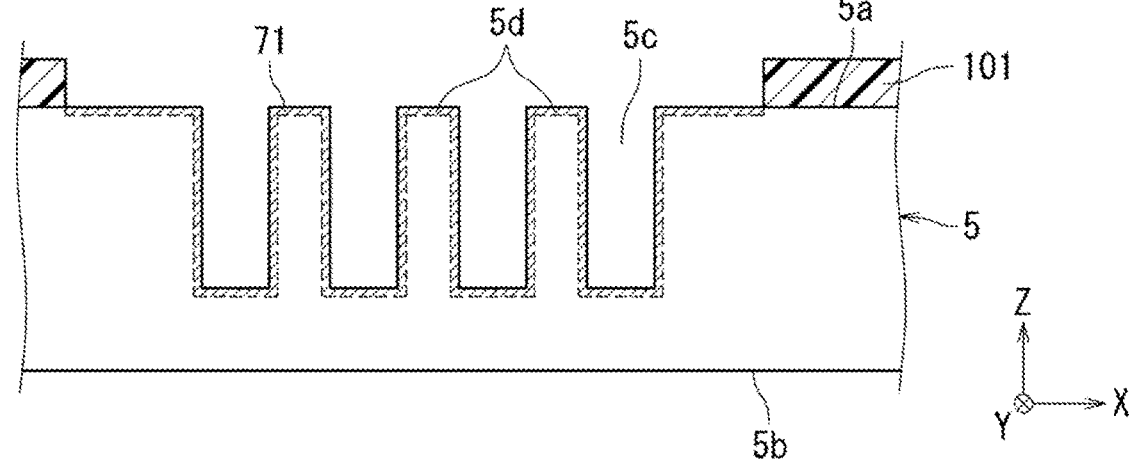
FIG. 6C is an explanatory view for explaining the manufacturing method of the electronic component.

As illustrated in FIG. 6C, a resist 101 is patterned on the first main surface 5a, and an impurity such as phosphorus is doped using a gas such as phosphine (PH₃). Thus, the first electrode portion 71 which is a doped layer is formed on the first main surface 5a.

Figure 6D:
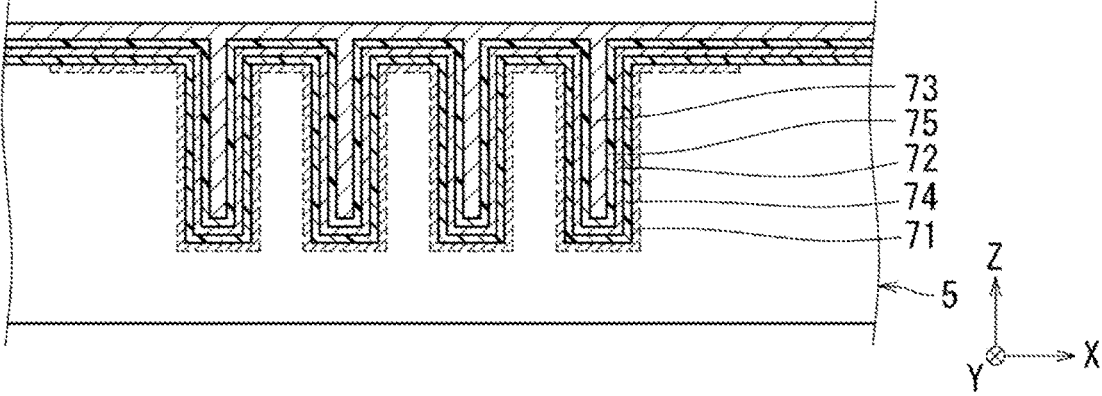
FIG. 6D is an explanatory view for explaining the manufacturing method of the electronic component.

As illustrated in FIG. 6D, the first dielectric portion 74, the second electrode portion 72, the second dielectric portion 75, and the third electrode portion 73 are sequentially formed on the first electrode portion 71. At this time, formation is performed using, for example, chemical vapor deposition, atomic layer deposition, or the like. Note that the first electrode portion 71 may be a heavily impurity-doped polysilicon electrode, and the first dielectric portion 74 may be an insulating film of a high-K silicon oxide film such as hafnium oxide.

Figure 6E:
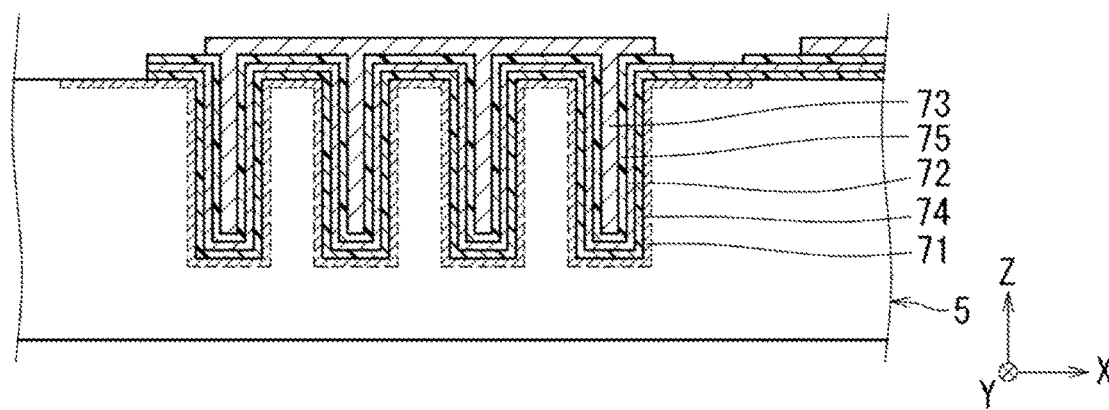
FIG. 6E is an explanatory view for explaining the manufacturing method of the electronic component.

As illustrated in FIG. 6E, the third electrode portion 73, the second dielectric portion 75, the second electrode portion 72, and the first dielectric portion 74 are sequentially etched in a predetermined pattern using photolithography. At this time, a part of the first electrode portion 71 is exposed, and a part of the second electrode portion 72 is exposed.

Figure 6F:
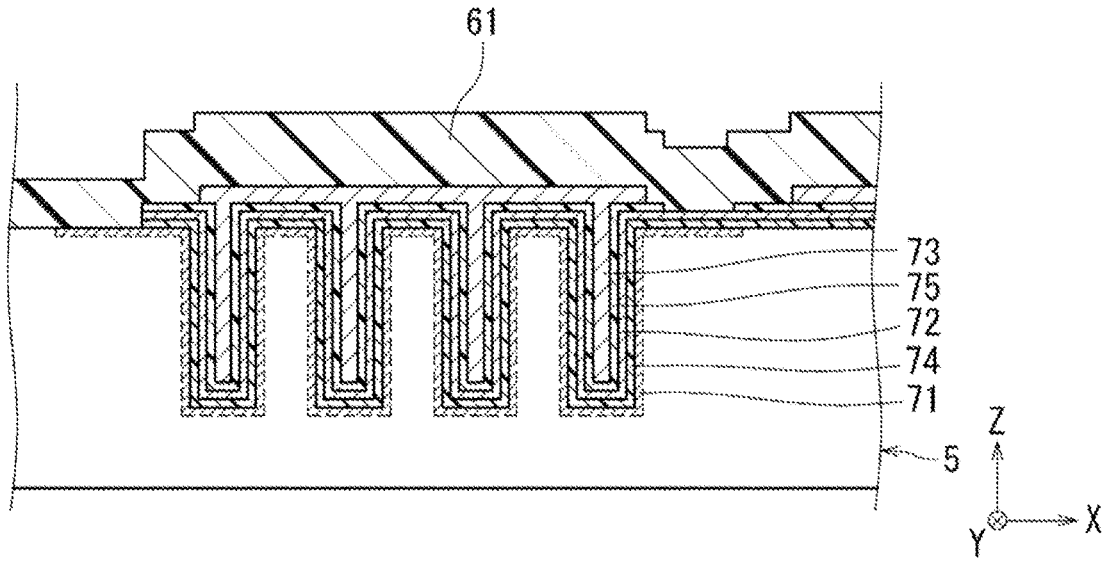
FIG. 6F is an explanatory view for explaining the manufacturing method of the electronic component.
Figure 6G:
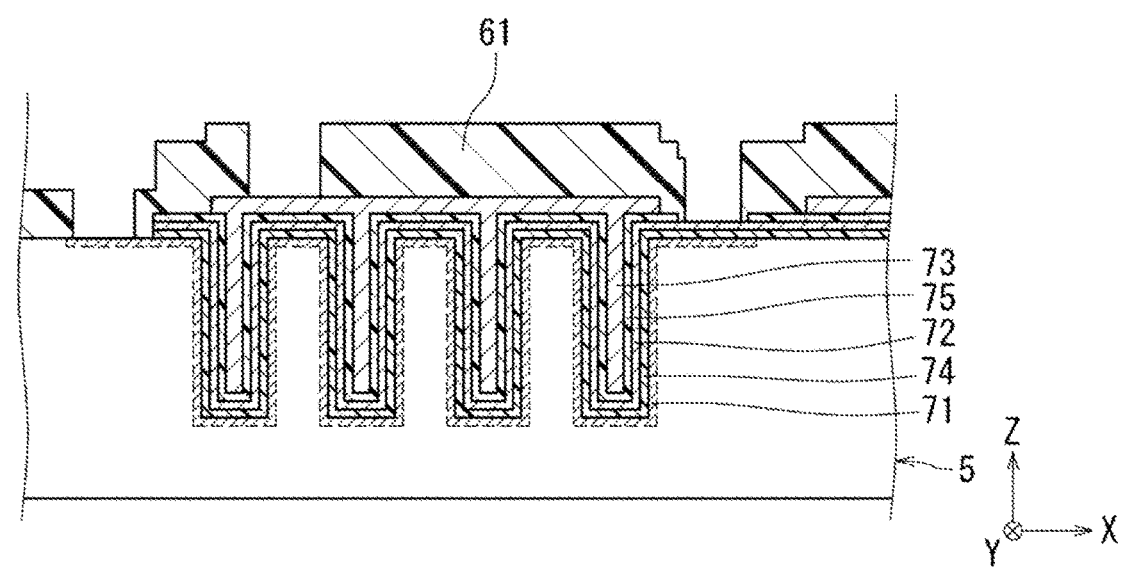
FIG. 6G is an explanatory view for explaining the manufacturing method of the electronic component.

As illustrated in FIG. 6F, the first insulating layer 61 is formed on the first electrode portion 71, the second electrode portion 72, and the third electrode portion 73 by using chemical vapor deposition, atomic layer deposition, or the like. As illustrated in FIG. 6G, the first insulating layer 61 is etched in a predetermined pattern by photolithography. At this time, a part of the first electrode portion 71 is exposed, a part of the second electrode portion 72 is exposed, and a part of the third electrode portion 73 is exposed.

Figure 6H:
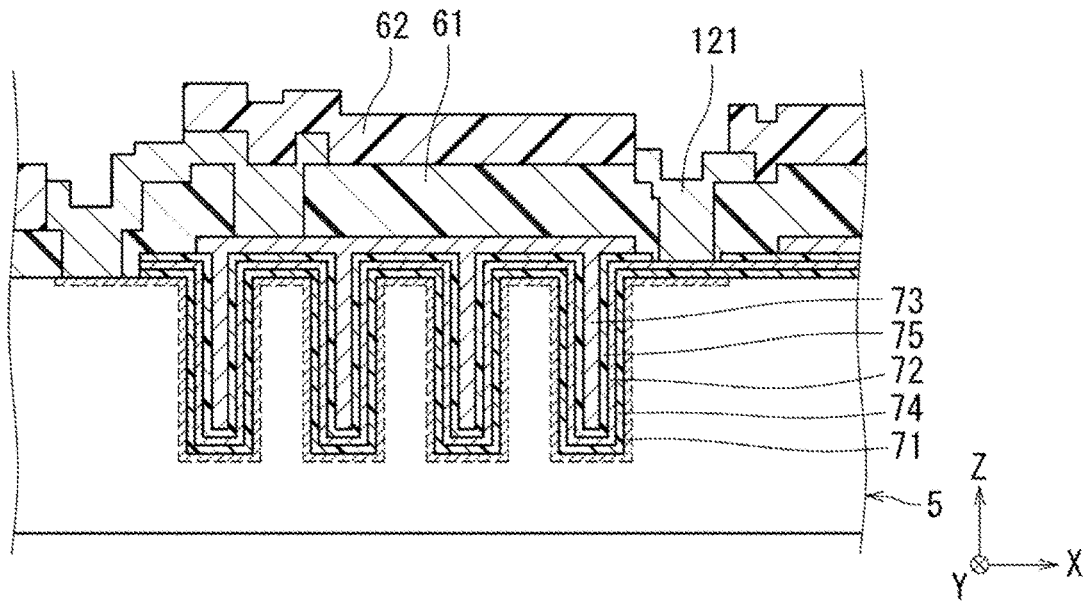
FIG. 6H is an explanatory view for explaining the manufacturing method of the electronic component.

As illustrated in FIG. 6H, a first conductive layer 121 is formed on a part of the first electrode portion 71, a part of the second electrode portion 72, and a part of the third electrode portion 73 by using chemical vapor deposition, atomic layer deposition, or the like, and the first conductive layer 121 is etched in a predetermined pattern by using photolithography. At this time, a part of the first electrode portion 71 and a part of the third electrode portion 73 are electrically connected, and a part of the first electrode portion 71 and a part of the second electrode portion 72 are not electrically connected. In this way, the capacitor element 7 is formed on the substrate 5 using the inorganic material.

Then, the second insulating layer 62 is formed on the first insulating layer 61 and the first conductive layer 121 by chemical vapor deposition, atomic layer deposition, or the like, and the second insulating layer 62 is etched in a predetermined pattern by photolithography. At this time, a first portion of the first conductive layer 121 connected to the first electrode portion 71 and the third electrode portion 73 is exposed, and a second portion of the first conductive layer 121 connected to the second electrode portion 72 is exposed.

Figure 6I:
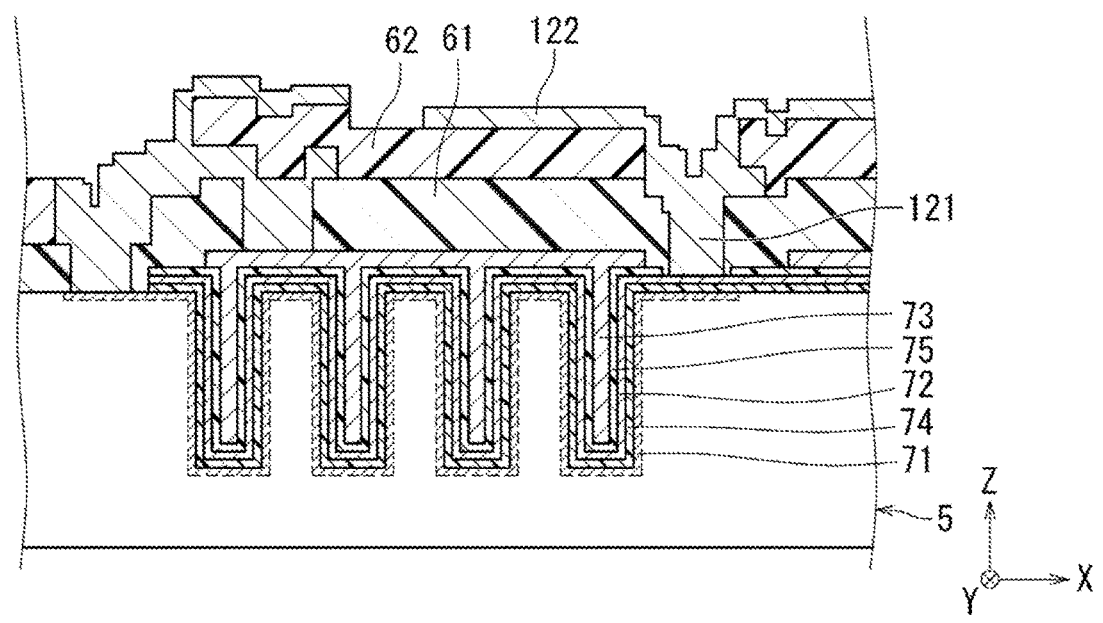
FIG. 6I is an explanatory view for explaining the manufacturing method of the electronic component.

Thereafter, a seed layer (not illustrated) is formed on the first conductive layer 121 and the second insulating layer 62. Then, a resist (not illustrated) is attached, and a predetermined pattern is formed on the resist using photolithography. As illustrated in FIG. 6I, while power is supplied to the seed layer, the second conductive layer 122 corresponding to the shield conductor layer 81 and the connection conductor layer 91 is formed on the first conductive layer 121 and the second insulating layer 62 by an electrolytic plating method. Thereafter, the resist is peeled off, and the seed layer is etched. In this way, the shield layer 8 and the connection layer 9 are formed on the capacitor element 7.

Figure 6J:
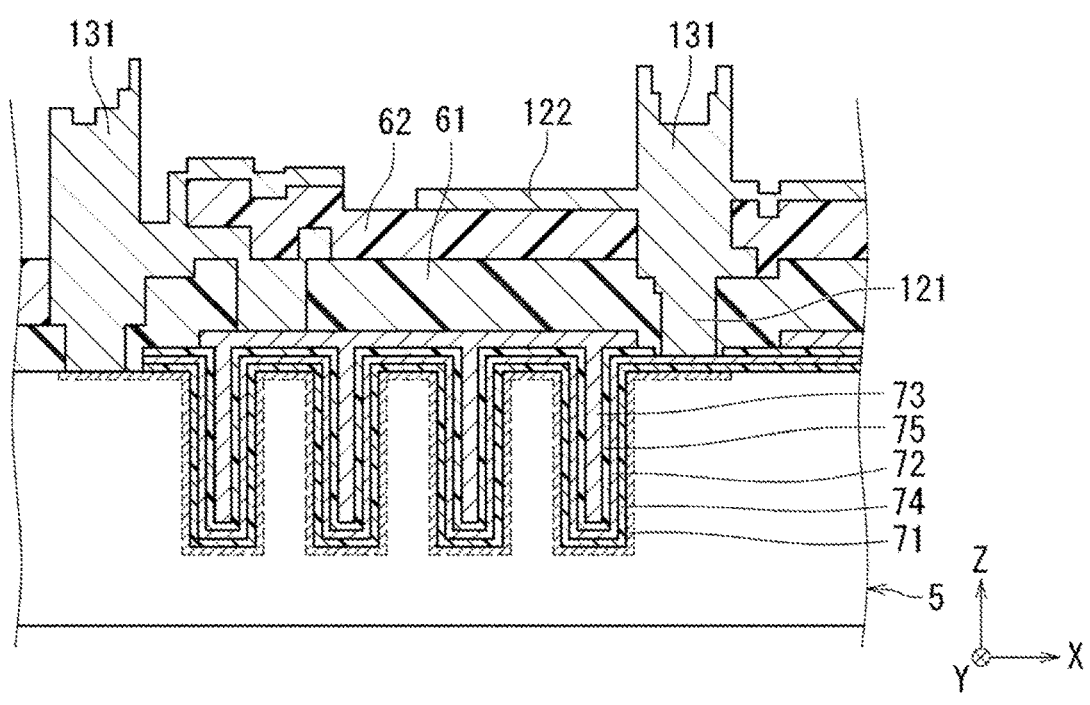
FIG. 6J is an explanatory view for explaining the manufacturing method of the electronic component.

Thereafter, a seed layer (not illustrated) is formed on the second conductive layer 122. Then, a resist (not illustrated) is attached, and a predetermined pattern is formed on the resist using photolithography. As illustrated in FIG. 6J, a first vertical conductive layer 131 is formed on the second conductive layer 122 using an electrolytic plating method while power is supplied to the seed layer. Thereafter, the resist is peeled off, and the seed layer is etched. At this time, the first vertical conductive layer 131 has a first portion and a second portion not electrically connected to the first portion. The first portion of the first vertical conductive layer 131 is provided at a position overlapping the first portion of the first conductive layer 121 and corresponds to the sixth vertical wire 56. The second portion of the first vertical conductive layer 131 is provided at a position overlapping the second portion of the first conductive layer 121 and corresponds to a part of the third vertical wire 53.

Figure 6K:
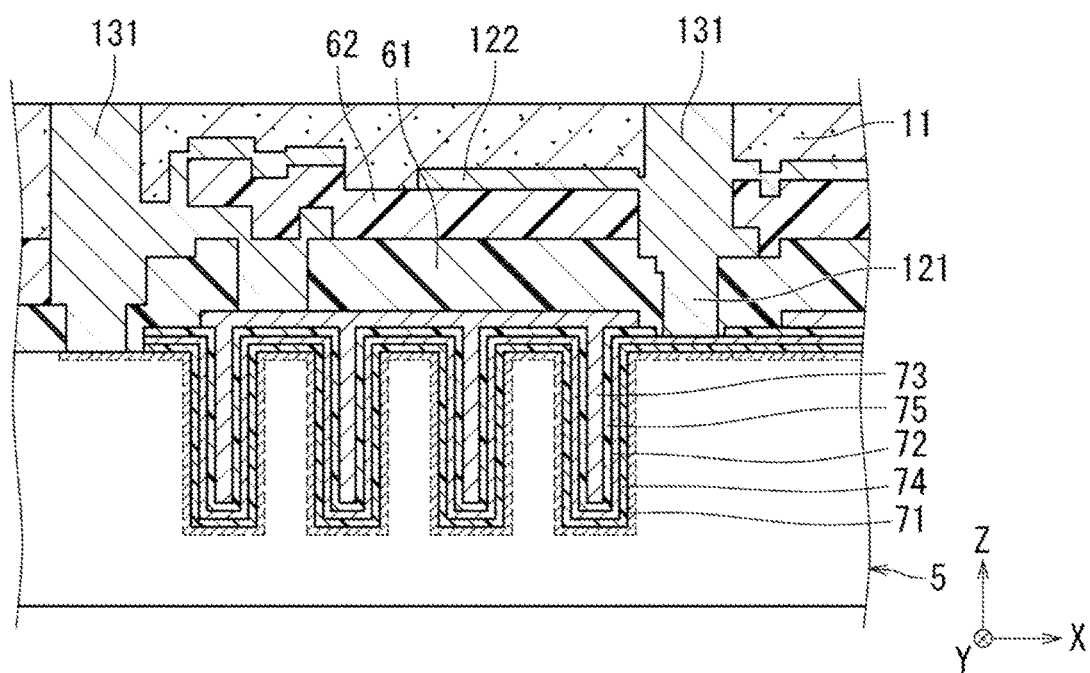
FIG. 6K is an explanatory view for explaining the manufacturing method of the electronic component.

As illustrated in FIG. 6K, the first magnetic layer 11 is pressure-bonded from above the first vertical conductive layer 131, and the first vertical conductive layer 131 is covered with the first magnetic layer 11. Thereafter, the upper surface of the first magnetic layer 11 is ground to expose the end surface of the first portion of the first vertical conductive layer 131 and the end surface of the second portion of the first vertical conductive layer 131 from the upper surface of the first magnetic layer 11.

Figure 6L:
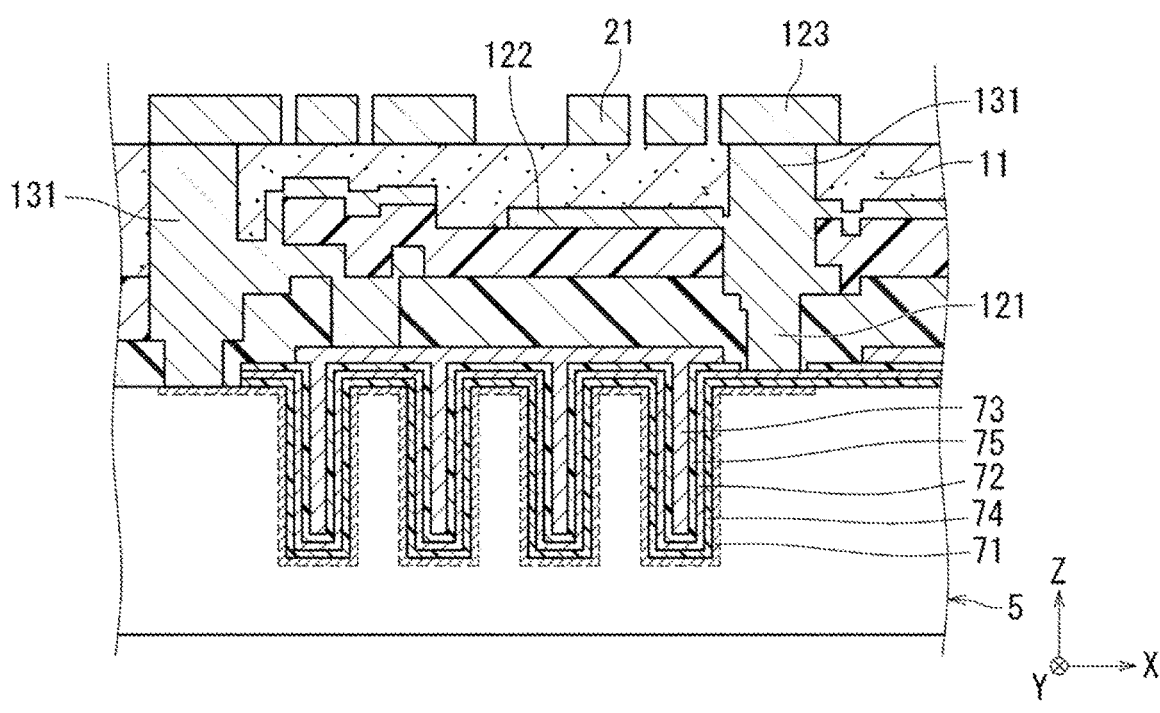
FIG. 6L is an explanatory view for explaining the manufacturing method of the electronic component.

Thereafter, a seed layer (not illustrated) is formed on the first magnetic layer 11. Then, a dry film resist (DFR) is attached, and a predetermined pattern is formed in the DFR using photolithography. As illustrated in FIG. 6L, while power is supplied to the seed layer, the inductor wire 21 and a connection wire 123 not connected to the inductor wire 21 are formed on the first magnetic layer 11 by an electrolytic plating method. Thereafter, the DFR is peeled off, and the seed layer is etched. At this time, the inductor wire 21 is connected to the first portion of the first vertical conductive layer 131, and the connection wire 123 is connected to the second portion of the first vertical conductive layer 131. Note that an insulating layer may be patterned on the first magnetic layer 11, or a plurality of layers of inductor wires may be formed.

Figure 6M:
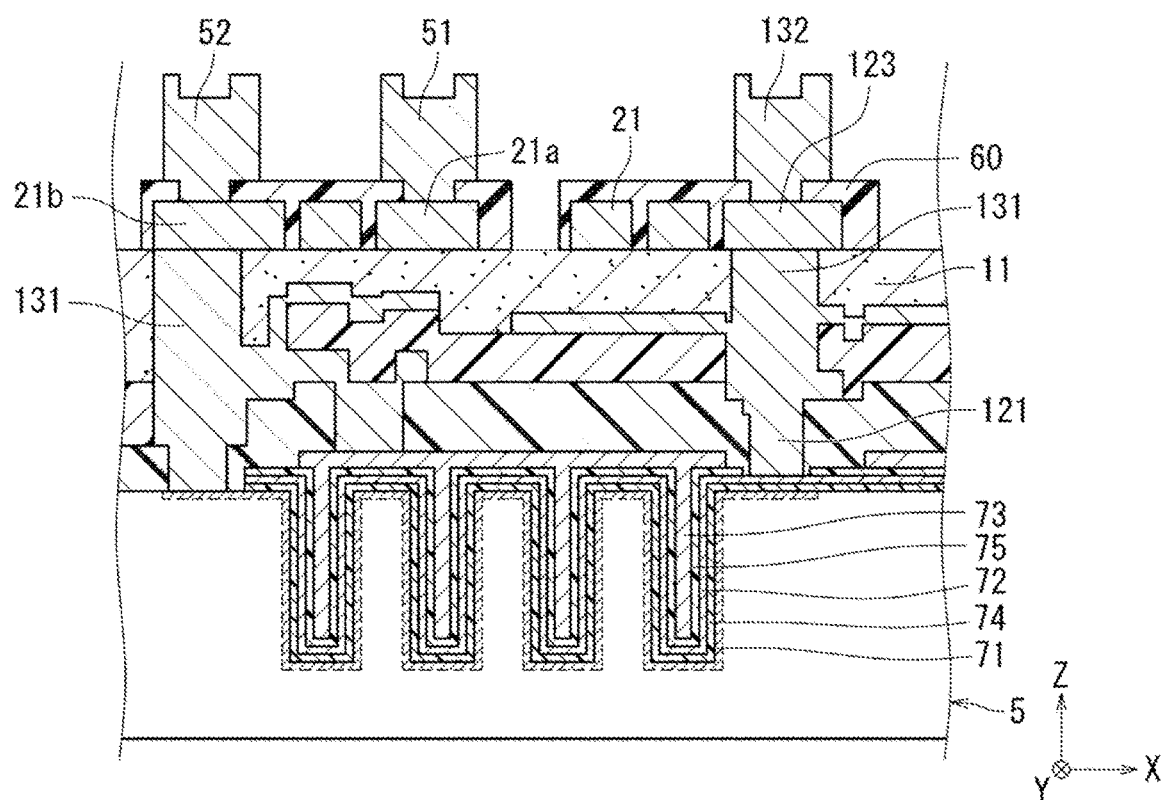
FIG. 6M is an explanatory view for explaining the manufacturing method of the electronic component.

As illustrated in FIG. 6M, the insulator 60 is applied onto the inductor wire 21 and the connection wire 123 and cured. Thereafter, the insulator 60 is irradiated with a laser to form a cavity such that a portion of the upper surface of the inductor wire 21 to which the via wire is connected and a portion of the upper surface of the connection wire 123 to which the via wire is connected are exposed.

Thereafter, a seed layer is formed on the insulator 60. The DFR is attached again, and a predetermined pattern is formed in the DFR using photolithography. The predetermined pattern is a through hole corresponding to a position where the columnar wire on the inductor wire 21 and the connection wire 123 is provided. The via wire and the columnar wire are formed on the inductor wire 21 and the connection wire 123 using electrolytic plating. That is, the first vertical wire 51 is formed on the first end 21a of the inductor wire 21, the second vertical wire 52 is formed on the second end 21b of the inductor wire 21, and the second vertical conductive layer 132 is formed on the connection wire 123. The connection wire 123 and the second vertical conductive layer 132 correspond to a part of the third vertical wire 53. Thereafter, the DFR is peeled off, and the seed layer is etched.

Figure 6N:
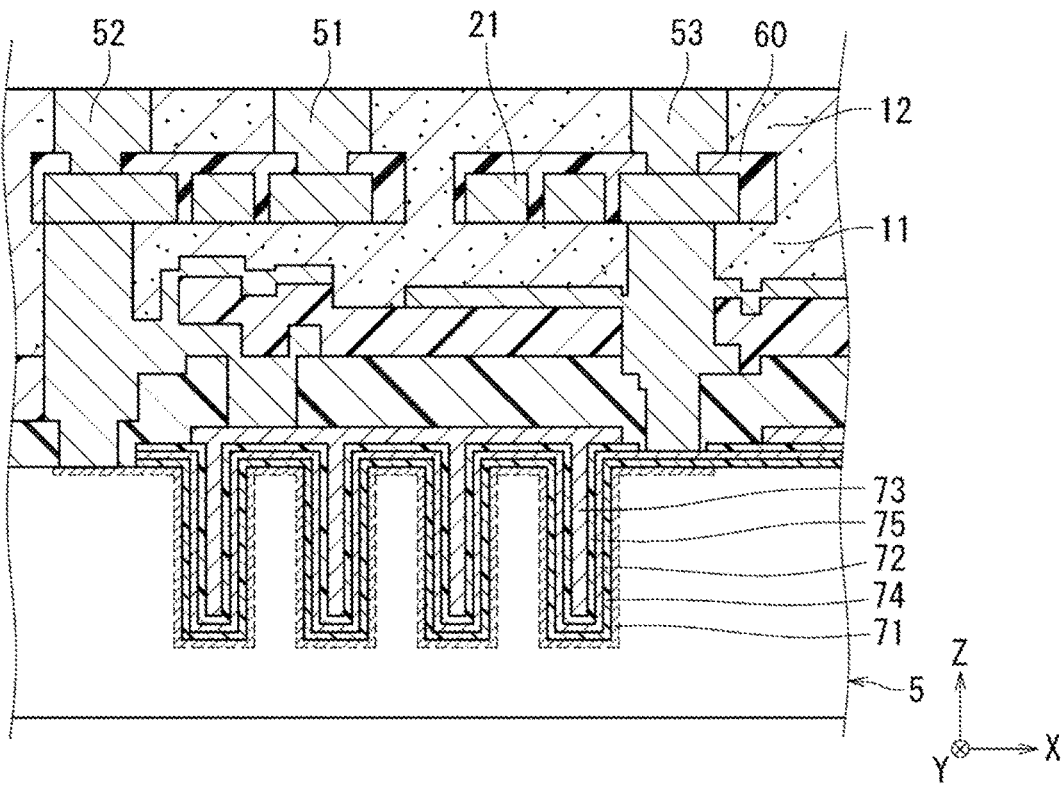
FIG. 6N is an explanatory view for explaining the manufacturing method of the electronic component.

As illustrated in FIG. 6N, a second magnetic layer 12 is pressure-bonded from above the first vertical wire 51, the second vertical wire 52, and the third vertical wire 53 toward the inductor wire 21, and the inductor wire 21, the first vertical wire 51, the second vertical wire 52, and the third vertical wire 53 are covered with the second magnetic layer 12. Thereafter, the upper surface of the second magnetic layer 12 is ground, and the end surfaces of the first vertical wire 51, the second vertical wire 52, and the third vertical wire 53 are exposed from the upper surface of the second magnetic layer 12. The first magnetic layer 11 and the second magnetic layer 12 form an element body 10. In this way, the inductor element 2 is formed on the first main surface 5a of the substrate 5 on a layer different from the capacitor element 7 using the organic material.

Figure 6O:
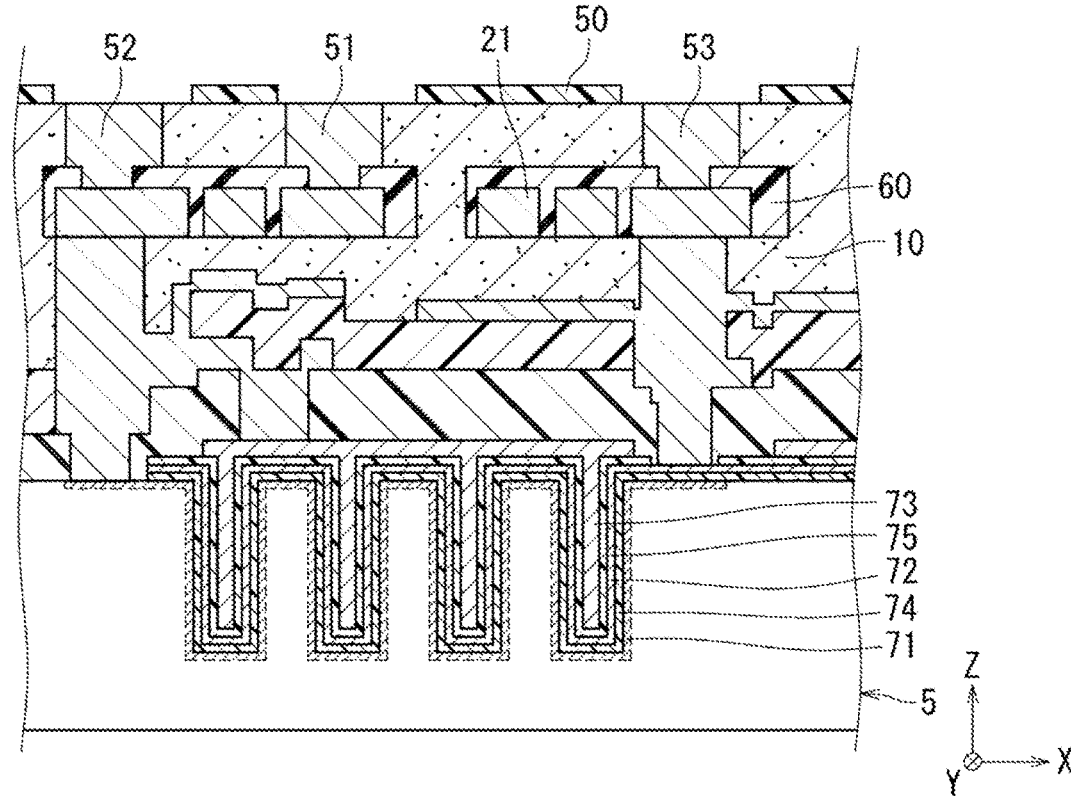
FIG. 6O is an explanatory view for explaining the manufacturing method of the electronic component.

As illustrated in FIG. 6O, an insulating layer to be the coating film 50 is applied to the upper surface of the element body 10. Then, the insulating layer is formed in a predetermined pattern by photolithography and cured. The predetermined pattern is a pattern in which the coating film 50 can cover a region of the upper surface of the element body 10 excluding a region where the first external terminal 41, the second external terminal 42, and the third external terminal 43 are formed. The lower surface of the substrate 5 may be removed by polishing, and the thickness of the substrate 5 can be adjusted.

Figure 6P:
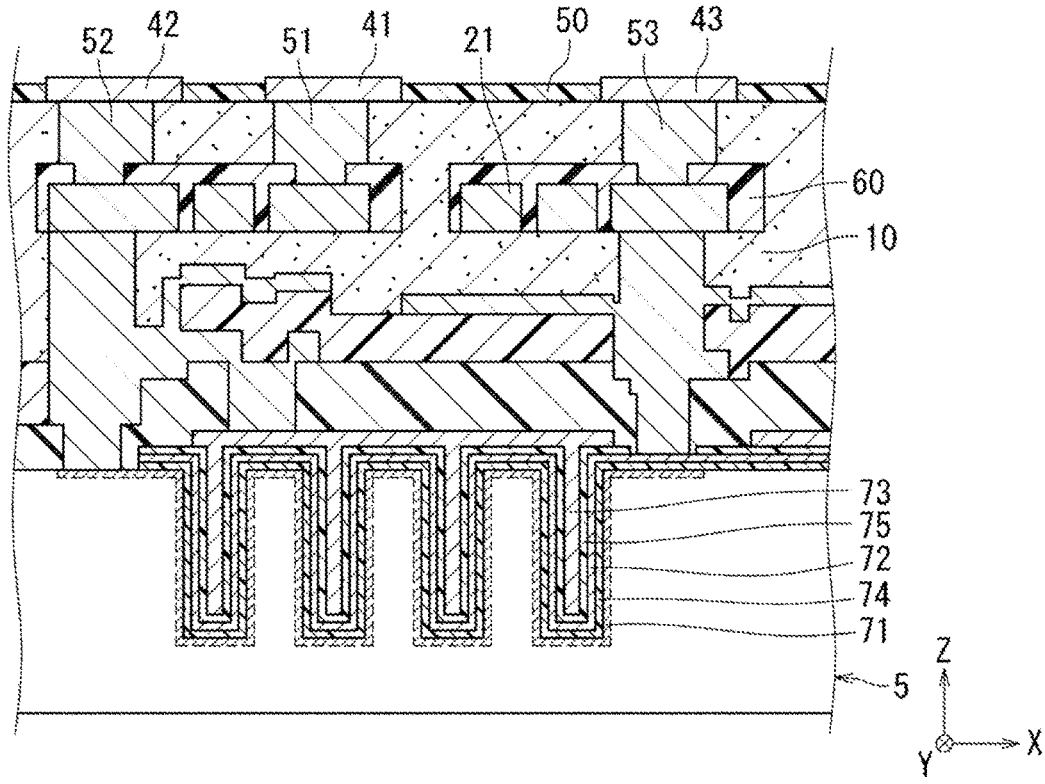
FIG. 6P is an explanatory view for explaining the manufacturing method of the electronic component.
Figure 6Q:
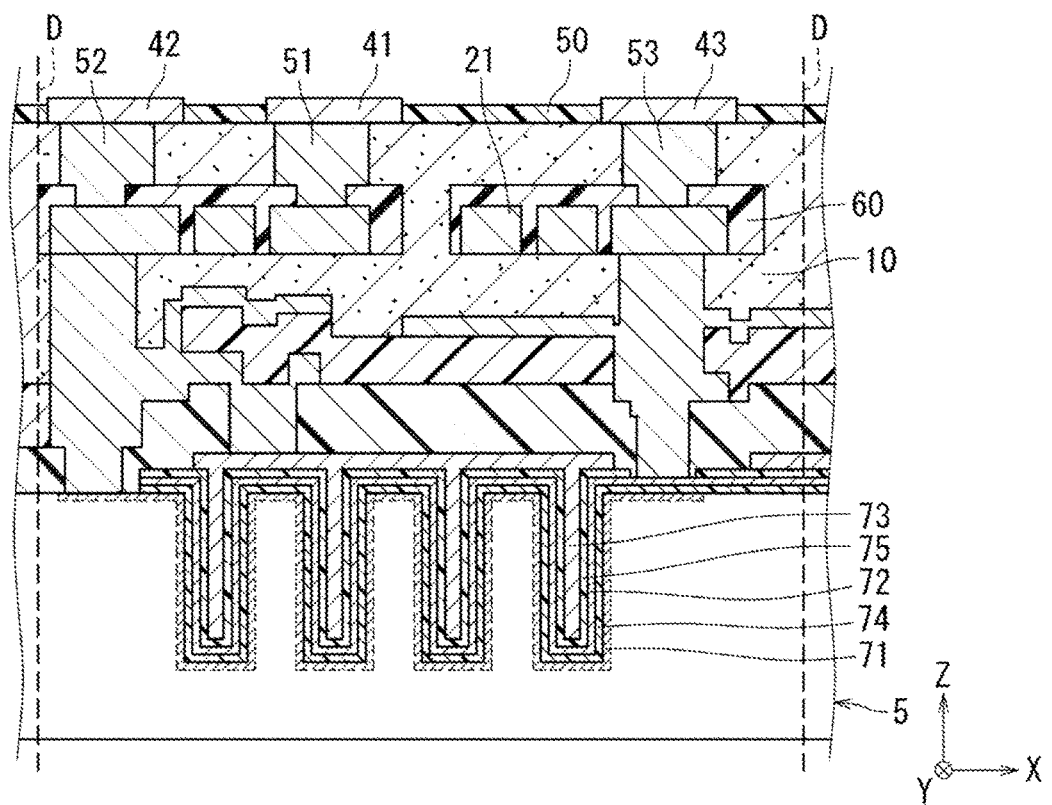
FIG. 6Q is an explanatory view for explaining the manufacturing method of the electronic component.

As illustrated in FIG. 6P, the first external terminal 41, the second external terminal 42, and the third external terminal 43 are formed by electroless plating so as to cover the end surfaces of the first vertical wire 51, the second vertical wire 52, and the third vertical wire 53 exposed from the element body 10. The first external terminal 41, the second external terminal 42, and the third external terminal 43 are, for example, Cu/Ni/Au laminated in this order from the third main surface 10a side.

As illustrated in FIG. 6Q, the electronic component 1 is divided by a cutting line D to manufacture the electronic component 1 as illustrated in FIG. 2.

As described above, the method for manufacturing the electronic component 1 includes forming the capacitor element 7 on the substrate 5 using an inorganic material; and forming the inductor element 2 on a layer different from the capacitor element 7 on the first main surface 5a of the substrate 5 using an organic material. The forming the inductor element 2 is performed after the forming the capacitor element 7.

According to the above configuration, since the inductor element 2 and the capacitor element 7 are provided on different layers, the mounting area of the electronic component 1 can be reduced. In addition, since the capacitor element 7 is first formed using the inorganic material remaining even after firing, and then the inductor element 2 is formed using the organic material scattered by heat, an unnecessary thermal load is not applied to the inductor element 2. As a result, it is possible to manufacture an electronic component capable of improving quality.

Second Embodiment

Figure 7:
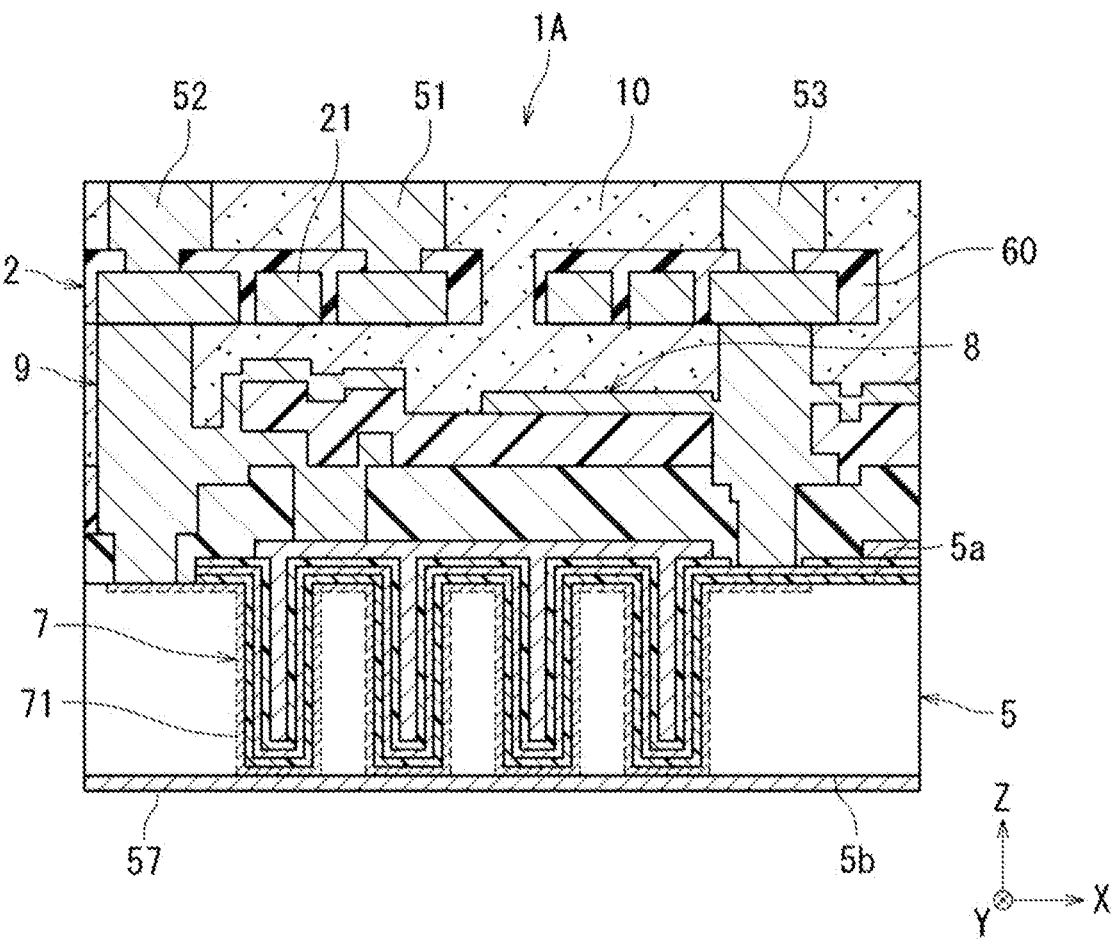
FIG. 7 is a sectional view illustrating a second embodiment of an electronic component.
Figure 8:
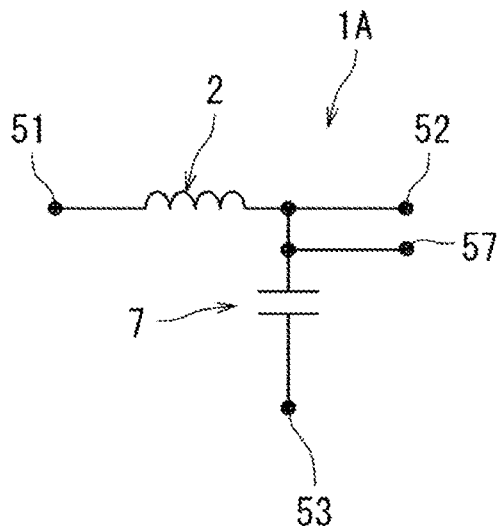
FIG. 8 is an equivalent circuit diagram of the second embodiment of the electronic component.

FIG. 7 is a sectional view illustrating a second embodiment of an electronic component. FIG. 7 is a sectional view corresponding to FIG. 2. FIG. 8 is an equivalent circuit diagram of the second embodiment of the electronic component. The second embodiment is different from the first embodiment in that a terminal wire connected to a capacitor element is provided. This different configuration will be described below. The other configurations are the same as those of the first embodiment, and are denoted by the same reference numerals as those of the first embodiment, and the description thereof will be omitted.

As illustrated in FIGS. 7 and 8, in an electronic component 1A of the second embodiment, a terminal wire 57 is provided on the second main surface 5b of the substrate 5. The terminal wire 57 is in contact with the first electrode portion 71 of the capacitor element 7, and is electrically connected to the first electrode portion 71. The terminal wire 57 is made of the same conductive material as the first to third vertical wires 51 to 53. For example, the second main surface 5b of the substrate 5 is ground so that the first electrode portion 71 is exposed. The terminal wire 57 is provided on the entire surface of the second main surface 5b so as to be in contact with all the exposed surfaces of the first electrode portion 71 from the second main surface 5*b*.

Third Embodiment

Figure 9:
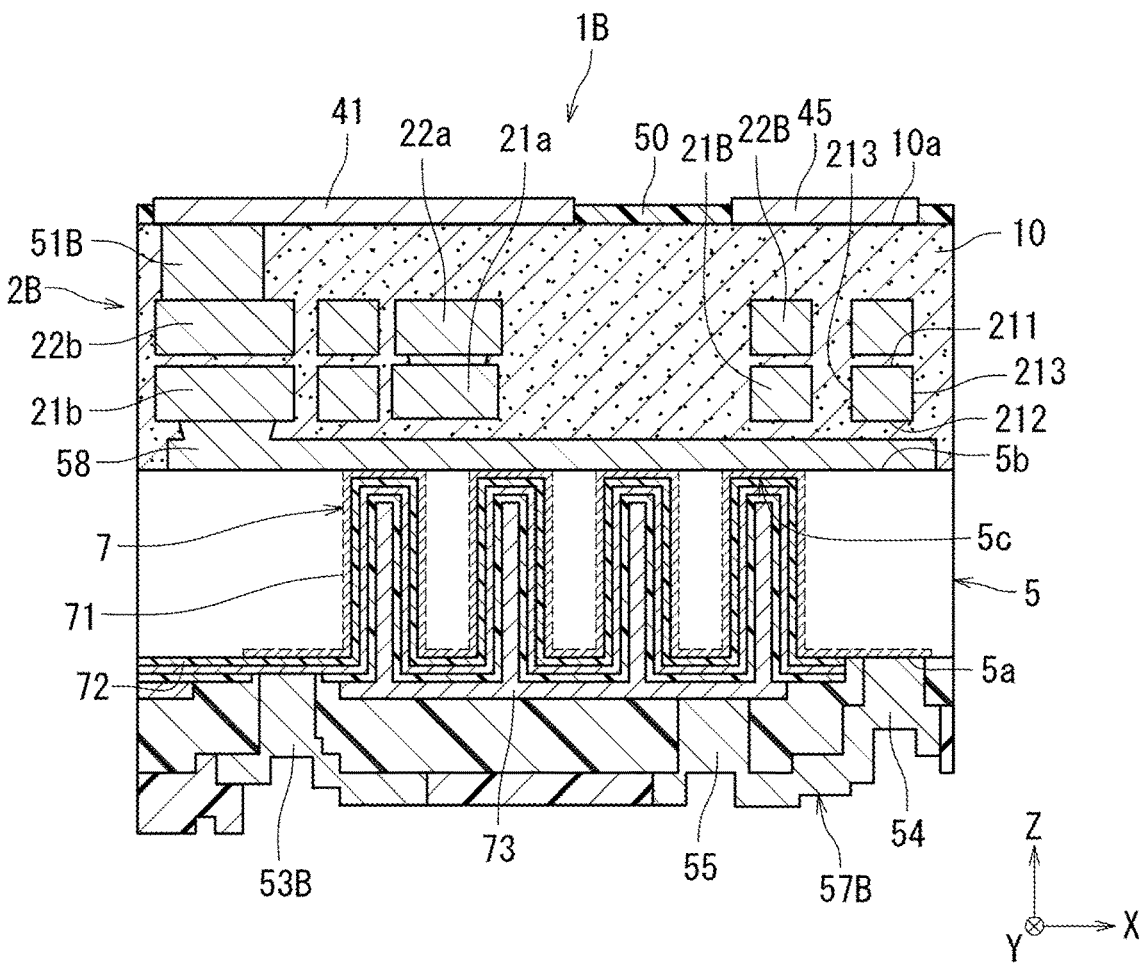
FIG. 9 is a sectional view illustrating a third embodiment of an electronic component.
Figure 10:
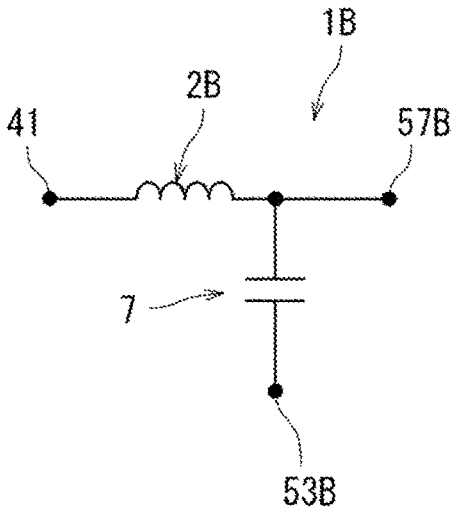
FIG. 10 is an equivalent circuit diagram of the third embodiment of the electronic component.

FIG. 9 is a sectional view illustrating a third embodiment of an electronic component. FIG. 9 is a sectional view corresponding to FIG. 2. FIG. 10 is an equivalent circuit diagram of the third embodiment of the electronic component. The third embodiment is different from the first embodiment in a positional relationship of an inductor element with respect to a substrate and a structure of the inductor element. This different configuration will be described below. The other configurations are the same as those of the first embodiment, and are denoted by the same reference numerals as those of the first embodiment, and the description thereof will be omitted.

As illustrated in FIGS. 9 and 10, in an electronic component 1B according to the third embodiment, an inductor element 2B is located on the side opposite to the substrate 5 from the opening side of the groove portion 5*c*. That is, the inductor element 2B is located on the second main surface 5*b* of the substrate 5. Accordingly, the capacitor element 7 and the inductor element 2 can be separated from each other, and interference between the capacitor element 7 and the inductor element 2 can be reduced.

The inductor element 2B includes a first inductor wire 21B and a second inductor wire 22B. Each of the first inductor wire 21B and the second inductor wire 22B has the same configuration as the inductor wire 21 of the first embodiment, and is a wire extending in a spiral shape along the first main surface 5*a*. The first inductor wire 21B and the second inductor wire 22B are arranged in order in the Z direction.

A first end 21*a* of the first inductor wire 21B is connected to a first end 22*a* of the second inductor wire 22B via a via wire. A second end 22*b* of the second inductor wire 22B is connected to the first external terminal 41 via a first vertical wire 51B. A second end 21*b* of the first inductor wire 21B is connected to a connection wire 58 via a via wire. The connection wire 58 is made of a conductive material similar to that of the first vertical wire 51B. The connection wire 58 is provided on the second main surface 5*b* of the substrate 5. The first electrode portion 71 of the capacitor element 7 is exposed to the second main surface 5*b* of the substrate 5. The connection wire 58 is in contact with the first electrode portion 71 of the capacitor element 7, and is electrically connected to the first electrode portion 71.

The first electrode portion 71 is connected to the fourth vertical wire 54. The third electrode portion 73 is connected to the fifth vertical wire 55. The fourth vertical wire 54 and the fifth vertical wire 55 are connected to each other to constitute a terminal wire 57B. The second electrode portion 72 is connected to a third vertical wire 53B. As a result, the terminal wire 57B and the third vertical wire 53B are located on the side opposite to the first external terminal 41.

Preferably, a dummy terminal 45 is provided on the third main surface 10*a* of the element body 10. The dummy terminal 45 is not electrically connected to the inductor element 2B and the capacitor element 7. The dummy terminal 45 is used, for example, as a marker indicating directivity of the electronic component 1B.

Preferably, in the first inductor wire 21B, at least one surface of the top surface 211 and the bottom surface 212 and the two side surfaces 213 are in contact with the element body 10. In this embodiment, the top surface 211, the bottom surface 212, and the two side surfaces 213 are in contact with the element body 10 (magnetic layer). According to this, the volume of the element body 10 can be increased, and the inductance can be improved. Note that the top surface 211 or the bottom surface 212 may be in contact with a nonmagnetic layer such as an insulator.

Fourth Embodiment

Figure 11:
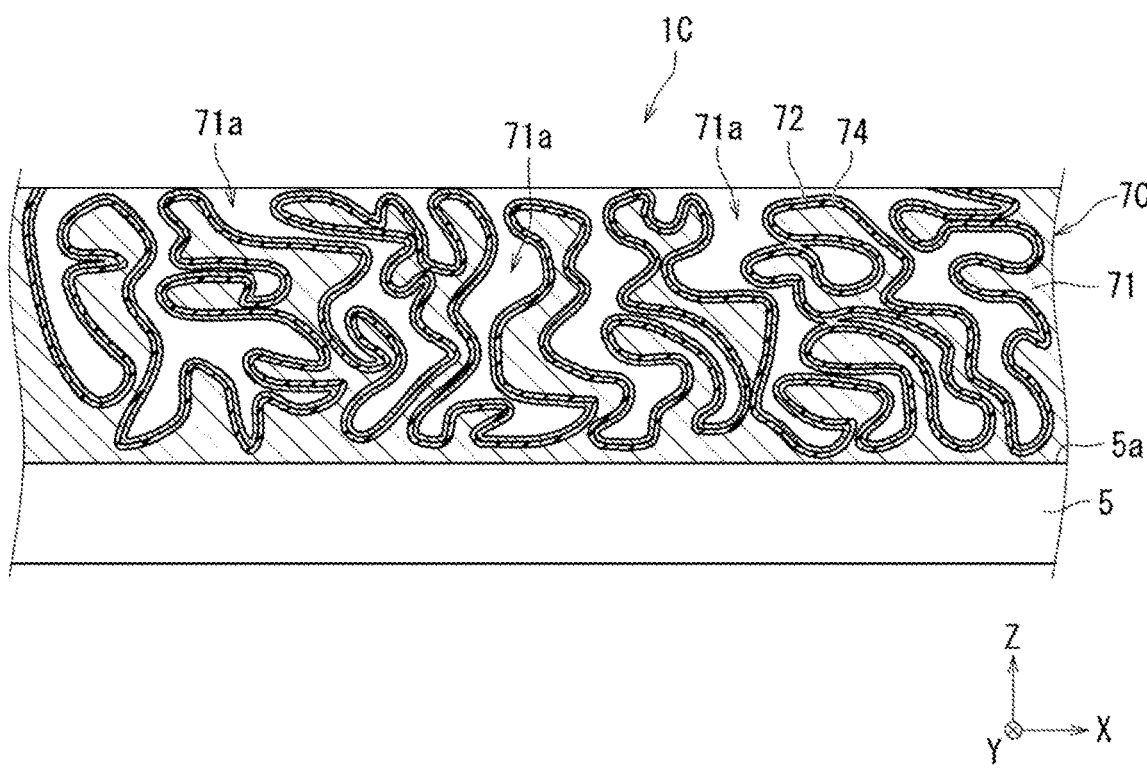
FIG. 11 is a sectional view illustrating a fourth embodiment of an electronic component.

FIG. 11 is a sectional view illustrating a fourth embodiment of an electronic component. FIG. 11 is a sectional view corresponding to FIG. 2. The fourth embodiment is different from the first embodiment in a structure of a capacitor element. This different configuration will be described below. Other configurations are the same as those of the first embodiment, and the description thereof will be omitted.

As illustrated in FIG. 11, in a capacitor element 7C of an electronic component 1C of the fourth embodiment, the first electrode portion 71 is a porous metal layer provided on the first main surface 5*a*. The porous metal layer has pores 71*a* extending in a direction intersecting the first main surface 5*a*. The first dielectric portion 74 is provided on the inner surfaces of the pores 71*a*. The second electrode portion 72 is laminated on the first dielectric portion 74. Although not illustrated, the second dielectric portion 75 and the third electrode portion 73 are sequentially laminated on the second electrode portion 72. According to this, since the porous metal layer is provided, the surface areas of the first electrode portion 71 and the first dielectric portion 74 can be increased, and the capacitance of the capacitor element 7C can be increased. The porous metal layer may be provided on the second main surface 5*b* of the substrate 5.

A method for manufacturing the capacitor element 7C will be described. The porous metal layer can be prepared by a method such as etching, sintering, or a dealloying method. For example, a metal such as aluminum is deposited on the substrate 5, the metal is etched to be made porous, and a porous metal layer as a first electrode portion is attached onto the substrate 5. Thereafter, a thin film dielectric portion is formed on the surface of the porous metal layer using chemical vapor deposition, atomic layer deposition, or the like. As a result, a dielectric portion is formed on the inner surfaces of the pores of the porous metal layer. Thereafter, a thin film second electrode portion is formed on the surface of the dielectric portion using chemical vapor deposition, atomic layer deposition, or the like. Further, similarly, the second dielectric portion and the third electrode portion are sequentially formed.

As another capacitor element, the porous metal layer may be used as the first dielectric portion. That is, the first electrode portion is formed on the substrate by doping or thin film, an oxide film (insulator) such as $Al_2O_3$ is then formed on the first electrode portion, the oxide film is etched to make the oxide film porous, and the porous metal layer (oxide film) as the first dielectric portion is attached onto the first electrode portion. Thereafter, the second electrode portion, the second dielectric portion, and the third electrode portion are sequentially formed on the inner surfaces of the pores of the porous metal layer.

Fifth Embodiment

Figure 12:
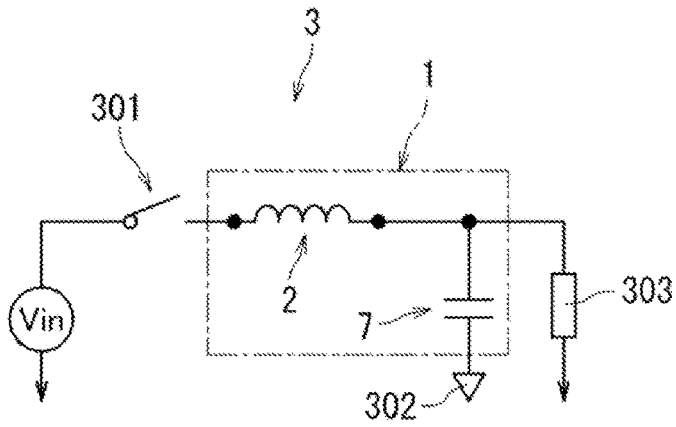
FIG. 12 is a schematic diagram illustrating an embodiment of an electronic circuit.

FIG. 12 is a schematic diagram illustrating an embodiment of an electronic circuit. As illustrated in FIG. 12, an electronic circuit 3 includes the electronic component 1, a switching element 301 electrically connected to the inductor element 2, a ground 302 electrically connected to the capacitor element 7, and a load element 303 electrically connected to the inductor element 2 and the capacitor element 7. According to this, a small DC-DC converter can be provided.

The electronic component 1 is the electronic component of the first embodiment, but may be any of the electronic components of the second to fourth embodiments. The switching element 301 is, for example, a CMOS switch. The switching element 301 is connected to an input voltage (Vin). The load element 303 is, for example, a resistor. The electronic component may have a plurality of inductor elements or a plurality of capacitor elements.

Note that the present disclosure is not limited to the above-described embodiments, and can be modified in design without departing from the gist of the present disclosure. For example, the respective feature points of the first to fifth embodiments may be variously combined.

In the above embodiments, the inductor wire of the inductor element generates a magnetic flux in the magnetic layer when a current flows to impart inductance to the inductor element, and the structure, shape, material, and the like of the inductor wire are not particularly limited. In particular, various known wire shapes such as a meander wire can be used without being limited to a straight line or a curve (spiral=two-dimensional curve) extending on a plane as in the embodiment.

In the above embodiments, at least two electrode portions of the capacitor element may be provided, and electric charges may be stored between the two electrode portions through the dielectric portion by applying a voltage to the two electrode portions. The structure, shape, material, and the like of the electrode portions are not particularly limited. In particular, the electrode portions are not limited to the meander shape in section as in the embodiments, and various known electrode shapes such as a flat plate can be used.

What is claimed is:

1. An electronic component comprising:
   a substrate having a first main surface and a second main surface facing each other and containing a silicon element;
   at least one capacitor element on the first main surface of the substrate;
   at least one inductor element on the first main surface or the second main surface of the substrate in a direction orthogonal to the first main surface with respect to the capacitor element and electrically connected to the capacitor element; and
   a connection layer that connects the capacitor element and the inductor element between the capacitor element and the inductor element,
   wherein the capacitor element includes:
       a first electrode portion extending in a direction intersecting the first main surface between the first main surface and the second main surface, and located on a side facing the substrate;
       a second electrode portion that extends in the direction intersecting the first main surface between the first main surface and the second main surface, and faces the first electrode portion in a direction parallel to the first main surface; and
       a dielectric portion between the first electrode portion and the second electrode portion,
   wherein the inductor element includes:
       an element body having a third main surface on a side opposite to the substrate and containing a magnetic material;
       an inductor wire in the element body and extending in the direction parallel to the first main surface; and a vertical wire that is in the element body, is connected to an end of the inductor wire, and extends to the third main surface,
   wherein a thickness of the inductor wire is larger than a thickness of the second electrode portion, and
   wherein the connection layer includes a connection conductor layer, and the connection conductor layer does not go around more than one turn.

2. The electronic component according to claim 1, further comprising:
   a shield layer between the capacitor element and the inductor element,
   wherein the shield layer includes a shield conductor layer extending in the direction parallel to the first main surface.

3. The electronic component according to claim 2, wherein
   the thickness of the inductor wire is larger than a thickness of the shield conductor layer.

4. The electronic component according to claim 2, wherein
   the connection conductor layer extends in the direction parallel to the first main surface.

5. The electronic component according to claim 1, wherein
   the connection conductor layer extends in the direction parallel to the first main surface.

6. The electronic component according to claim 5, wherein
   the thickness of the inductor wire is larger than a thickness of the connection conductor layer.

7. The electronic component according to claim 1, wherein
   the capacitor element includes a vertical wire that is connected to the first electrode portion or the second electrode portion, extends to the third main surface through the element body, and is not connected to the inductor wire.

8. The electronic component according to claim 1, wherein
   the thickness of the inductor wire is 10 times or more the thickness of the second electrode portion.

9. The electronic component according to claim 1, wherein
   a composition of the inductor wire is different from a composition of each of the first electrode portion and the second electrode portion.

10. The electronic component according to claim 1, wherein
   the capacitor element has a thickness of 100 μm or less, the inductor element has a thickness of 200 μm or less, and the electronic component has a thickness of 300 μm or less.

11. The electronic component according to claim 1, further comprising:
   at least one of the following:
   the at least one capacitor element is a plurality of capacitor elements; and
   the at least one inductor element is a plurality of inductor elements.

12. The electronic component according to claim 1, further comprising:
   a connection layer that connects the capacitor element and the inductor element between the capacitor element and the inductor element,
   wherein the connection layer includes a first end surface on a side facing the inductor element and a second end surface on a side facing the capacitor element, and includes a vertical wire extending in the direction orthogonal to the first main surface, and an area of the first end surface is larger than an area of the second end surface.

13. The electronic component according to claim 1, wherein the substrate includes a groove portion on a side of the first main surface into which the second electrode portion is inserted, and the inductor element is on a side opposite to an opening of the groove portion with respect to the substrate.

14. The electronic component according to claim 1, wherein the substrate includes a groove portion on a side of the first main surface into which the second electrode portion extends, and the inductor element is on an opening side of the groove portion with respect to the substrate.

15. The electronic component according to claim 1, wherein the substrate includes a groove portion on a side of the first main surface into which the second electrode portion extends, and when viewed from the direction orthogonal to the first main surface, a shape of the first main surface of the substrate excluding the groove portion includes a plurality of polygons, and a number of vertices of the polygon is six or more.

16. The electronic component according to claim 1, wherein the first electrode portion is a porous metal layer on the first main surface or the second main surface, the porous metal layer includes pores extending in the direction intersecting the first main surface, the dielectric portion is on an inner surface of the pores, and the second electrode portion is on the dielectric portion.

17. The electronic component according to claim 1, wherein an electrical resistivity of the substrate is 1 Ω·cm or less.

18. The electronic component according to claim 1, wherein in a cross section orthogonal to an extending direction of the inductor wire, the inductor wire has a top surface and a bottom surface parallel to the first main surface, and two side surfaces orthogonal to the first main surface, and at least one of the top surface and the bottom surface and the two side surfaces orthogonal to the first main surface are in contact with the element body.

19. An electronic circuit comprising:

the electronic component according to claim 1;

a switching element electrically connected to the inductor element;

a ground electrically connected to the capacitor element; and a load element electrically connected to the inductor element and the capacitor element.

20. An electronic component comprising:

a substrate having a first main surface and a second main surface facing each other and containing a silicon element;

at least one capacitor element on the first main surface of the substrate;

at least one inductor element on the first main surface or the second main surface of the substrate in a direction orthogonal to the first main surface with respect to the capacitor element and electrically connected to the capacitor element; and a connection layer that connects the capacitor element and the inductor element between the capacitor element and the inductor element, wherein the capacitor element includes:

a first electrode portion extending in a direction intersecting the first main surface between the first main surface and the second main surface, and located on a side facing the substrate;

a second electrode portion that extends in the direction intersecting the first main surface between the first main surface and the second main surface, and faces the first electrode portion in a direction parallel to the first main surface; and a dielectric portion between the first electrode portion and the second electrode portion, wherein the inductor element includes:

an element body having a third main surface on a side opposite to the substrate and containing a magnetic material;

an inductor wire in the element body and extending in the direction parallel to the first main surface; and a vertical wire that is in the element body, is connected to an end of the inductor wire, and extends to the third main surface, wherein a thickness of the inductor wire is larger than a thickness of the second electrode portion, and wherein the connection layer includes a first end surface on a side facing the inductor element and a second end surface on a side facing the capacitor element, and includes a vertical wire extending in the direction orthogonal to the first main surface, and an area of the first end surface is larger than an area of the second end surface.

\* \* \* \* \*